(12) United States Patent
Itoh et al.

(10) Patent No.: US 6,191,990 B1
(45) Date of Patent: Feb. 20, 2001

(54) SEMICONDUCTOR INTEGRATED CIRCUIT DEVICE HAVING STABILIZING CAPACITORS CONNECTED BETWEEN POWER LINES OF MAIN AMPLIFIERS

(75) Inventors: Nobutaka Itoh, Ome; Shuichi Miyaoka, Hanno; Yuji Yokoyama; Michiaki Nakayama, both of Ome; Mitsugu Kusunoki, Kunitachi; Kazumasa Takashima; Hideki Sakakibara, both of Ome; Toru Kobayashi, Iruma, all of (JP)

(73) Assignee: Hitachi, Ltd., Tokyo (JP)

( * ) Notice: Under 35 U.S.C. 154(b), the term of this patent shall be extended for 0 days.

(21) Appl. No.: 09/507,785

(22) Filed: Feb. 22, 2000

(30) Foreign Application Priority Data

Feb. 23, 1999 (JP) .................................................. 11-044285

(51) Int. Cl.$^7$ ....................................................... G11C 7/02
(52) U.S. Cl. ......................... 365/208; 365/206; 365/207; 365/149; 365/230.06; 365/226; 365/228; 365/51; 365/63
(58) Field of Search ..................................... 365/206, 207, 365/208, 149, 230.03, 230.06, 226, 228, 51, 63

(56) References Cited

U.S. PATENT DOCUMENTS 5,848,001 * 12/1998 Kim ...................................... 365/190
5,862,091 * 1/1999 Bion et al. ............................. 365/207
6,028,802 * 2/2000 Nishikawa ............................ 365/207

FOREIGN PATENT DOCUMENTS

| 2177082 | 7/1990 | (JP) | .............................. G11C/11/409 |
| 3280298 | 12/1991 | (JP) | .............................. G11C/11/419 |
| 10074908 | 3/1998 | (JP) | .............................. H01L/27/108 |

* cited by examiner

Primary Examiner—Andrew Q. Tran
(74) Attorney, Agent, or Firm—Antonelli, Terry, Stout & Kraus, LLP

(57) ABSTRACT

A semiconductor integrated circuit device has a memory array which includes amplifying MOSFETs of sense amplifiers which amplify small voltages read out of dynamic memory cells onto bit lines and column switch MOSFETs which select bit lines, a read/write section which includes main amplifiers for reading out stored data from memory cells selected by the column switch, and a logic circuit which implements the input/output operation of data with the read/write section. Two capacitors each having a first electrode which corresponds to a plate electrode with the same structure as that of storage capacitors of dynamic memory cells and a second electrode which is multiple commonly-connected storage nodes of the storage capacitors are arranged in serial connection, disposed contiguously to the read/write section, and connected between operation voltage lines of the read/write section.

20 Claims, 15 Drawing Sheets

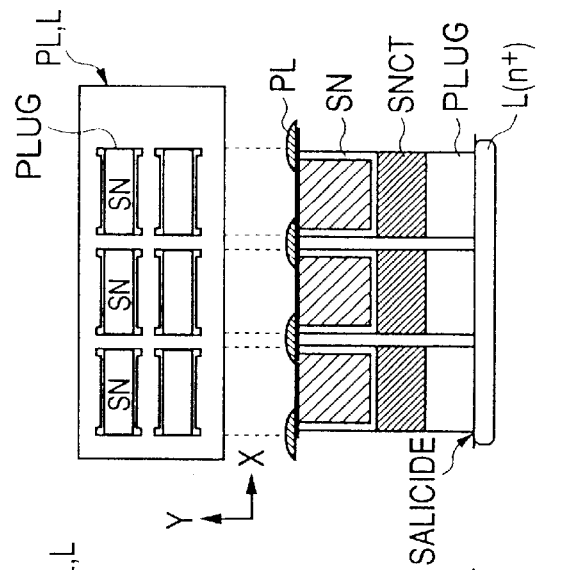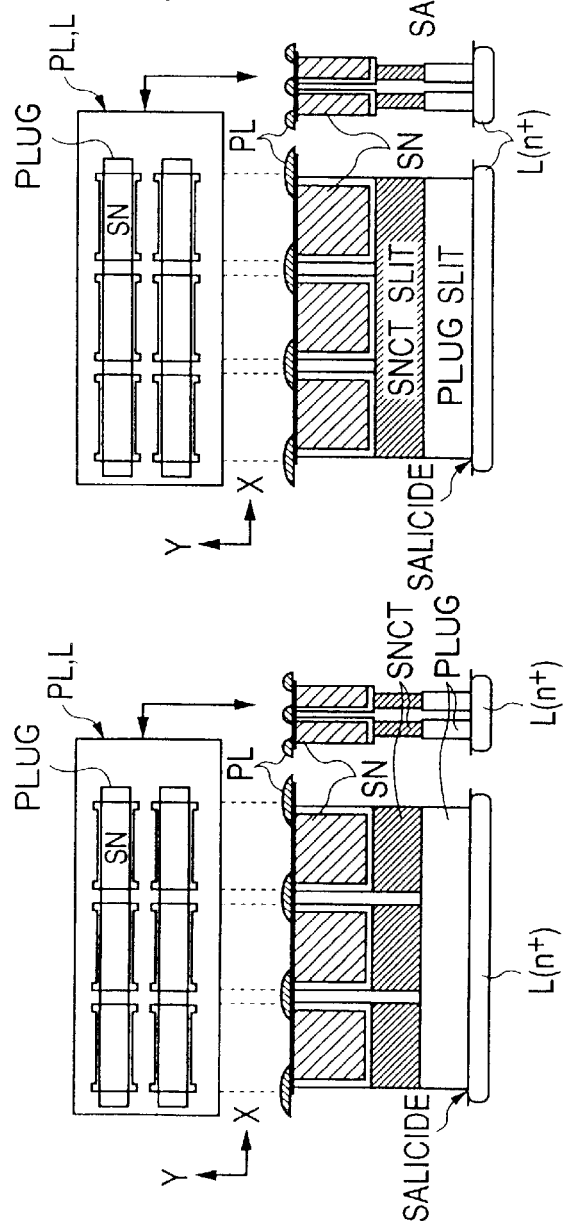

SEMICONDUCTOR INTEGRATED CIRCUIT DEVICE HAVING STABILIZING CAPACITORS CONNECTED BETWEEN POWER LINES OF MAIN AMPLIFIERS

TECHNICAL FIELD OF THE INVENTION

The Present invention relates to a semiconductor integrated circuit device, and primarily to a technique which is useful for a large-scale integrated circuit incorporating a dynamic RAM (random access memory) and an associated memory control logic circuit.

BACKGROUND OF THE INVENTION

Based on a study conducted after the present invention was made, the inventors of the present invention have discovered the presence of techniques described in Japanese laid-opened Patent Publications No. 10-74908, No. 3-280298 and No. 2-177082 which pertain to power noise suppression, as will be explained in the following. These patent publications described techniques for the suppression of power noises which arise during the amplifying operation of sense amplifiers which detect small signals read out of dynamic memory cells. Specifically, the technique described in Japanese laid-opened Patent Publication No. 10-74908 pertains to the disposition of capacitors, which are formed by the same process as that of storing capacitors of memory cells, between the power lines of the sense amplifiers. However, there is no description at all in this patent publication on power noises created by the main amplifiers for amplifying the outputs of sense amplifiers, which is a feature with which the present invention is concerned.

The inventors of the present invention have studied a scheme for the speed-up of the readout operation of the storage section, which employs dynamic memory cells for accomplishing a large storage capacity, based on the provision of a buffer memory formed of static memory cells so that data comprising a large number of bits are read out of the storage section to the buffer memory at once, thereby carrying out a data transaction with the outside through the buffer memory. Namely, the buffer memory is operated as a cache memory, so that the memory operation is sped up when seen from the outside of the semiconductor integrated circuit device.

In order to read out data comprising a large number of bits from dynamic memory cells, many main amplifiers are required in correspondence to the individual bits. The main amplifier, which amplifies the amplified signal from the sense amplifier, has a larger amplitude input signal as compared with a sense amplifier. It, at the same time, needs to deal with relatively large currents for the high-speed operation as compared with a sense amplifier. From the opposite viewpoint, it is necessary for the sense amplifier to minimize the operation current in order to sense stably a small signal which is read out to a bit line indicative of the presence or absence of information charges accumulated in a small storage capacitor.

Specifically, a signal which is read out to a bit line is a small voltage near the middle of the operation voltages, and the input of such a small voltage near the middle voltage to the sense amplifier of a CMOS latch configuration causes both the n-channel and p-channel amplifying MOSFETs to become conductive. Therefore, increasing the current for the sensing operation will result in the arising of large penetrating currents through the on-state amplifying MOSFETS. Due to the amplifying operation of the CMOS latch circuit based on the positive feedback of the output signals to the inputs, the readout signal voltage will fluctuate due to the influence of the penetrating currents, resulting in the high possibility of a read error.

Accordingly, the scheme of the above-mentioned patent publication for the speed-up of the sense amplifier, which is based on the setting of such a large operation current as to invoke a problem of noises created by its own amplifying operation and on the absorption of the noises by the capacitance, necessitates the provision of noise suppressing capacitors for many sense amplifiers provided in correspondence to rows of the memory cell array in the word line direction, and it is not advantageous from the viewpoint of utilizing the feature of dynamic memory cells which enables high-density integration. Instead, it is more rational to adopt the easier method of simply minimizing the operation current of the sense amplifier for primarily stabilizing the sense amplifier operation.

The main amplifier, which amplifies the amplified signal from the sense amplifier and deals with a larger amplitude input signal as compared with the sense amplifier, is capable of performing a stable and fast amplifying operation based on larger currents as compared with the sense amplifier. It was found, however, that when it is intended to read out memory cells of many bits at one time for a high-speed data transaction with the outside, in which case a huge number of main amplifiers are needed as compared with general-purpose dynamic RAMs, there emerges a problem of a malfunctioning of the logic circuit in the peripheral address selecting circuit and buffer memory.

Accordingly, it is an object of the present invention to provide a semiconductor integrated circuit device which incorporates a dynamic PAM, and is capable of accomplishing high-density integration and fast and stable operation. These and other objects and novel features of the present invention will become apparent from the following description taken in conjunction with the accompanying drawings.

SUMMARY OF THE INVENTION

Briefly, the present invention resides typically in a semiconductor integrated circuit device having amplifying MOSFETs of sense amplifiers for amplifying small voltages read out of dynamic memory cells onto bit lines, a memory array including column switch MOSFETs for selecting bit lines, a read/write section including main amplifiers for reading stored data out of memory cells selected by the column switch, and a logic circuit section which implements the input/output operation of data with the read/write section, wherein two capacitors, each having a first electrode which corresponds to a plate electrode with the same structure, of storage capacitors of the dynamic memory cells and a second electrode which is multiple commonly-connected storage nodes of the storage capacitors, are arranged in serial connection, disposed contiguously to the read/write section, and connected between the operation voltage lines of the read/write section.

BRIEF DESCRIPTION OF THE DRAWINGS

FIGS. 7(A), 7(B) and 7(C) are cross-sectional diagrams showing embodiments of the noise suppressing capacitor used in this invention;

BEST MODE FOR CARRYING OUT THE INVENTION

A preferred embodiment of the present invention will be described with reference to the accompanying drawings.

Figure 1:
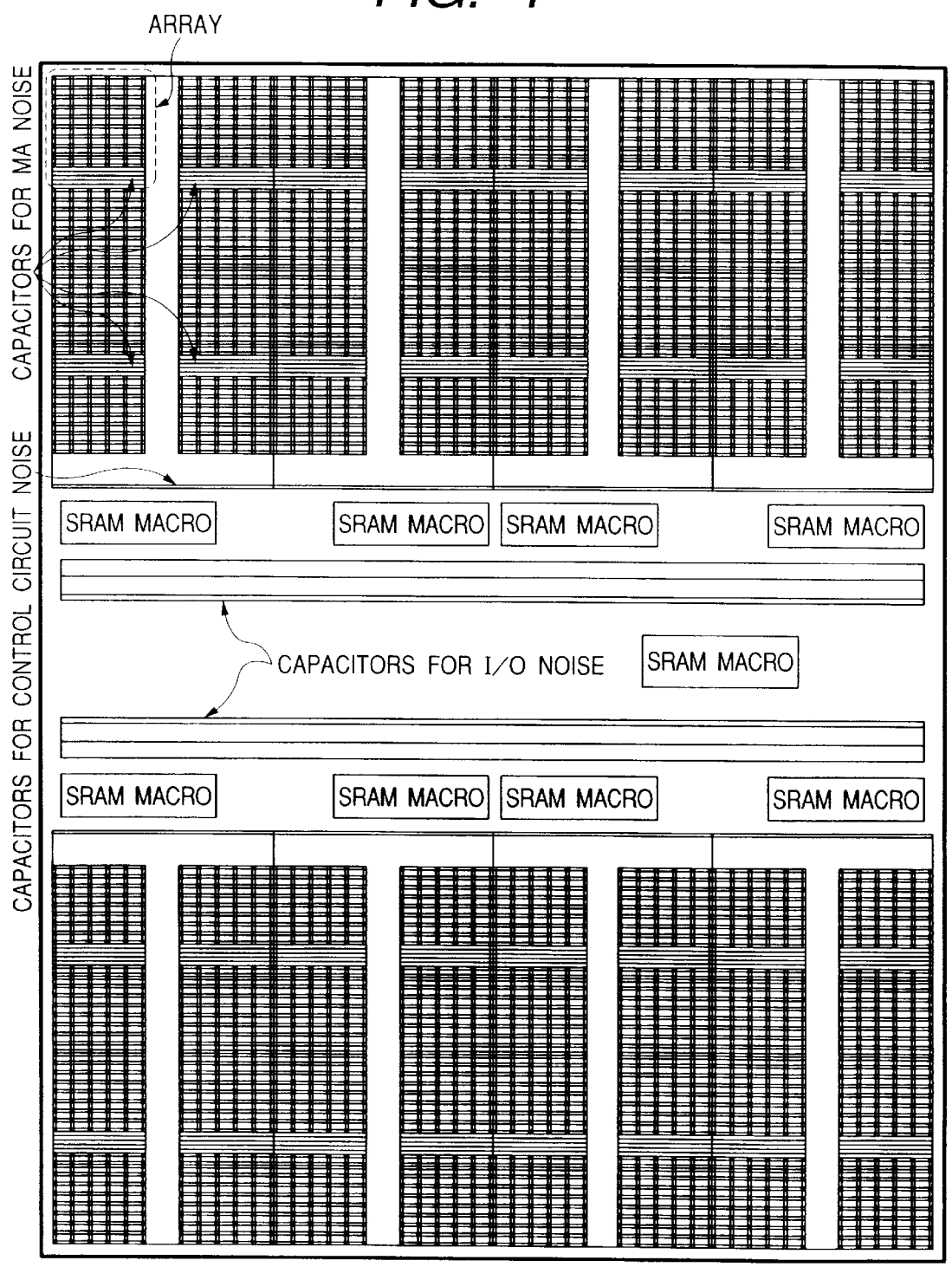
FIG. 1 is a layout diagram showing a semiconductor integrated circuit device incorporating a dynamic RAM based on an embodiment of this invention.

FIG. 1 shows the layout of a semiconductor integrated circuit device incorporating a dynamic RAM based on an embodiment of this invention. The figure shows distinctively the principal portion among the circuit blocks which constitute the inventive dynamic RAM. The semiconductor integrated circuit device is formed on a single semiconductor substrate of monocrystalline silicon or the like by a known fabrication technique for semiconductor integrated circuits.

In this embodiment, the memory section which is formed of dynamic memory cells is divided vertically into two sections in terms of the longitudinal direction of the chip (vertical direction of FIG. 1), although no limitation is imposed on the present invention with this regard. Each divided memory section is further divided into four memory array sections. Each memory array section is divided horizontally into two sections at the center of the peripheral circuit section which extends vertically in the figure. The peripheral circuit includes an x-axis address selecting circuit for word line selection, although no limitation is imposed on the invention in this regard. The two memory array sections on both sides of the peripheral circuit are each divided vertically into two sections. The two vertically-divided memory array sections are further divided vertically into two sections at the MA noise suppressing capacitors. Accordingly, one memory array section is divided vertically into four sections.

On the chip center side of the four memory array sections, a peripheral circuit is arranged. This peripheral circuit includes mainly a y-axis address selecting circuit for bit line selection. Further provided on the chip center side of the four memory array sections are static RAMs (SRAM macros) used for the buffer memory. Accordingly, eight static RAMs are disposed in correspondence to eight memory array sections which are vertically disposed in four divisions on a semiconductor chip. Further disposed contiguously to these static RAMs are logic circuits (not shown) for controlling the data input/output operation with the memory array sections.

At the center in the lateral direction of the semiconductor chip, there is disposed a first input/output circuit which implements the data transaction with external terminals which constitute a first I/O port. A static RAM (RAM macro) is disposed at the center of the chip, although no limitation is imposed on the invention with regard to the position. In contrast to the external terminals of the first I/O port, this static RAM implements a data transaction with external terminals which constitute a second I/O port. The static RAM enables a data transaction with SRAM macros as a buffer memory through the above-mentioned internal logic circuit. The first and second I/O ports are designed to transact 16-bit data, although no limitation is imposed on the invention with regard to the data size.

Figure 2:
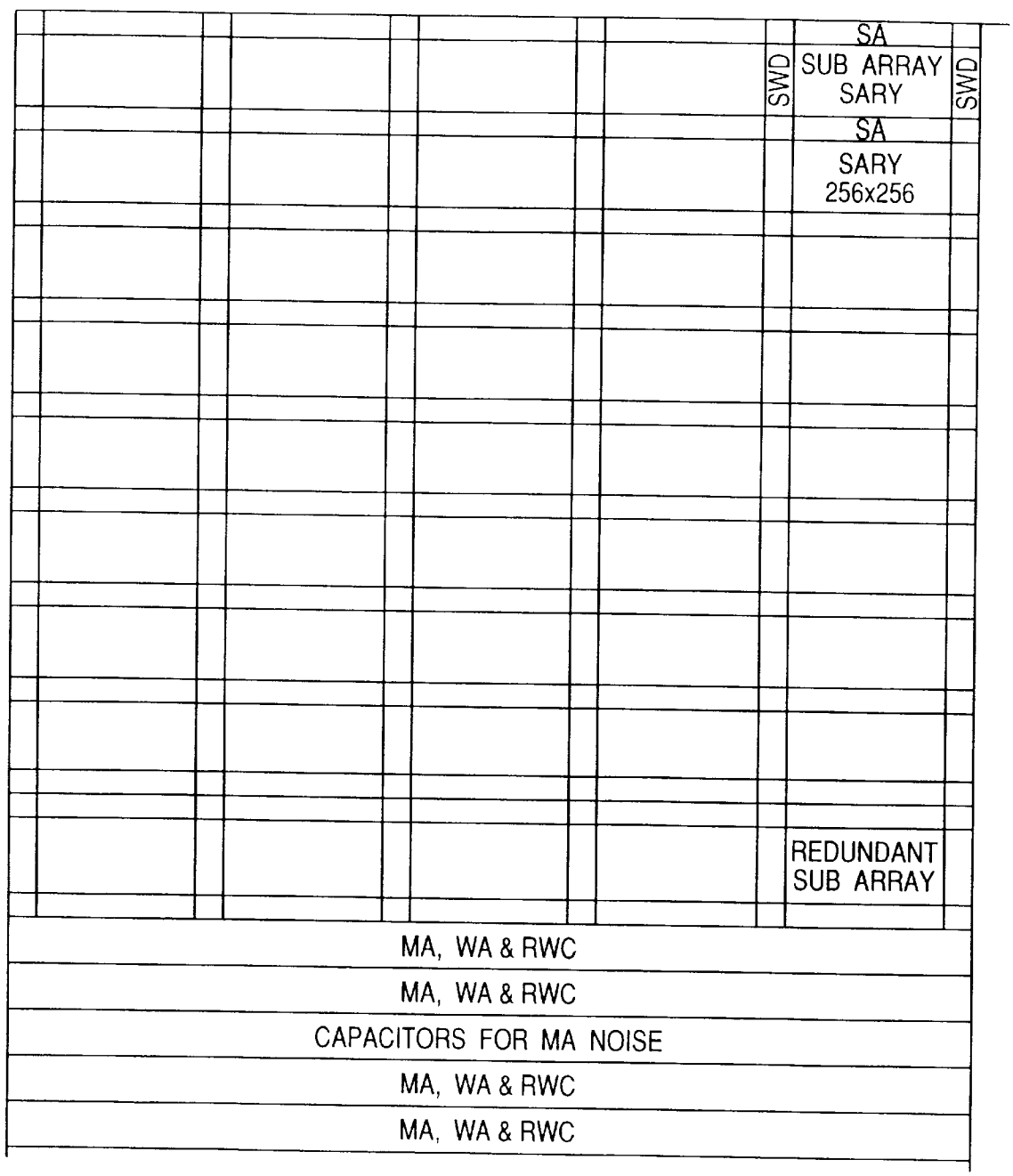
FIG. 2 is a layout diagram showing in detail part of the memory array section shown in FIG. 1.

FIG. 2 shows by enlargement part of the memory array section shown in FIG. 1. Specifically, the part of the array enclosed by the dotted line in FIG. 1 out of the memory cell array is shown. In this embodiment, sense amplifier areas SA are formed above and below each subarray SARY, i.e., memory cell array, and sub word driver areas SWD are formed on both sides of them. Accordingly, the memory cell array which is formed of dynamic memory cells in matrix arrangement is divided by the sense amplifier areas SA and sub word driver areas SWD.

The intersecting portions of the sense amplifier areas SA and sub word driver areas SWD are defined to be cross areas. The sense amplifiers formed in the sense amplifier area SA are disposed according to the shared sensing scheme, having complementary bit lines running right and left (up and down) from the sense amplifier SA, except for the sense amplifiers SA located at the top and bottom arrays, so, that these bit lines are connected selectively to complementary bit lines of the adjacent memory cell array on the right or left.

One subarray SARY shown by enlargement has 256 sub word lines and 256 pairs of intersecting complementary bit lines (or data lines), although no limitation is imposed on the invention with regard to the number of lines. One array is provided with eight regular subarrays SARY along the bit lines and five subarrays SARY along the word lines. Redundant subarrays are provided in the central portion in the bit line direction. The redundant subarrays have their own sense amplifiers so that memory cells can be selected independently.

One subarray has a storage capacity of 256-by-256, and one array has 40 (5-by-8) subarrays. Accordingly, one memory array section has a storage capacity of 256×256× 40×8, i.e., 20 megabits, approximately. One semiconductor integrated circuit device, which has eight divided memory array sections as mentioned previously, has a total of 160 megabits, approximately.

In this embodiment, four sub word lines are laid in the complementary bit line direction for one main word line, although no limitation is imposed on the invention with regard to the number of lines, in order to reduce the number of main word lines, or in other words, in order to relax the wiring pitch of the main word lines. For the selection of a sub word line out of the four sub word lines assigned in the complementary bit line direction, a sub word selecting driver SWD is disposed. This sub word selecting driver SWD produces a select signal for selecting one of four sub word select lines which runs in the direction of arrangement of sub word drivers.

In the array, one main word line and one sub word line, which is for five subarrays, are selected. The column selecting operation, which will be explained later, enables the transaction of data of a total of 36 bits through the main input/output lines which run in the longitudinal direction over the sub word drivers. In correspondence to the data size, there are provided 36 pairs of main amplifiers MA and write amplifiers WA below the array. In FIG. 2, the main amplifiers MA, write amplifiers WA and their associated control circuits RWC are disposed in two stages.

Disposed below these main amplifiers MA, write amplifiers WA and control circuits RWC, which are provided in two stages MA noise suppressing capacitors interposed therebetween, are other main amplifiers MA, write amplifiers WA and their associated control circuits RWC in two stages, which are provided for another array located in a much lower section (not shown) of the figure. Accordingly, there are two divided arrays and corresponding main amplifiers MA, write amplifiers WA and associated control circuits RWC arranged in a line symmetry fashion above and below the MA noise suppressing capacitors, as will be appreciated from the overall layout diagram of FIG. 1.

The memory array section is divided horizontally and vertically into four memory arrays as shown in FIG. 1, so that each of two memory arrays on the right side allow memory access of 72-bit width and each of two memory arrays on the left side allow memory access of 72-bit width, i.e., the arrangement allows memory access of a total of 288-bit width. Data of 288 bits is transferred on the path to/from SRAM macros in 144-bit units. Namely, the main amplifiers MA, write amplifiers WA and their associated control circuits RWC of 72×2 in number for two horizontally divided memory arrays among the four horizontally and vertically divided memory arrays are paired so that data is transferred to/from SRAM macros by being divided in two cycles, 144 bits at a time, for the upper and lower memory arrays.

On the part of the dynamic RAM, it is necessary to operate a large number of main amplifiers MA, such as 288, simultaneously for reading out data of 288 bits. Due to the relatively large amplitude of the input signals and the large number of amplifiers as compared with general-purpose DRAMs, although the penetrating current itself is smaller as compared with the sense amplifier SA, large currents flow on the power lines even in case the amplifiers are formed of CMOS latch circuits similar to the sense amplifier SA, resulting in the generation of significantly large noises.

The above-mentioned noise suppressing capacitors are provided for the power lines (VDD and VSS) of the main amplifiers MA so that noises arising on the power lines at the amplifying operation are suppressed. In consequence, it becomes possible to read out data of such a large number of bits as mentioned above at high speed. At the write operation, the write amplifiers operate simultaneously to write bits of data into a large number of memory cells, such as 288, producing charge and discharge currents of the parasitic capacitance of the bit lines connected to the memory cells and the intermediate input/output lines. The noise suppressing capacitors also work effectively for the suppression of noises on the power lines of VDD and VSS during data writing.

As shown in FIG. 1, noise suppressing capacitors are also disposed as control noise suppressing capacitors C between the control circuit (address selection circuit) of the DRAM section and the SRAM macros. Similarly, noise suppressing capacitors are disposed as I/O noise suppressing capacitors between the input/output circuit section and the RAM macros. These Capacitors C have the same structure as the MA noise suppressing capacitors explained previously. In consequence, for the semiconductor integrated circuit device which is partitioned largely into a DRAM section, SRAM macro section and input/output circuit section, the noise suppressing capacitors C disposed in the border areas of these circuit sections absorb noises which arise on the power lines, thereby contributing to the stable operation of the circuit device.

Figure 3:
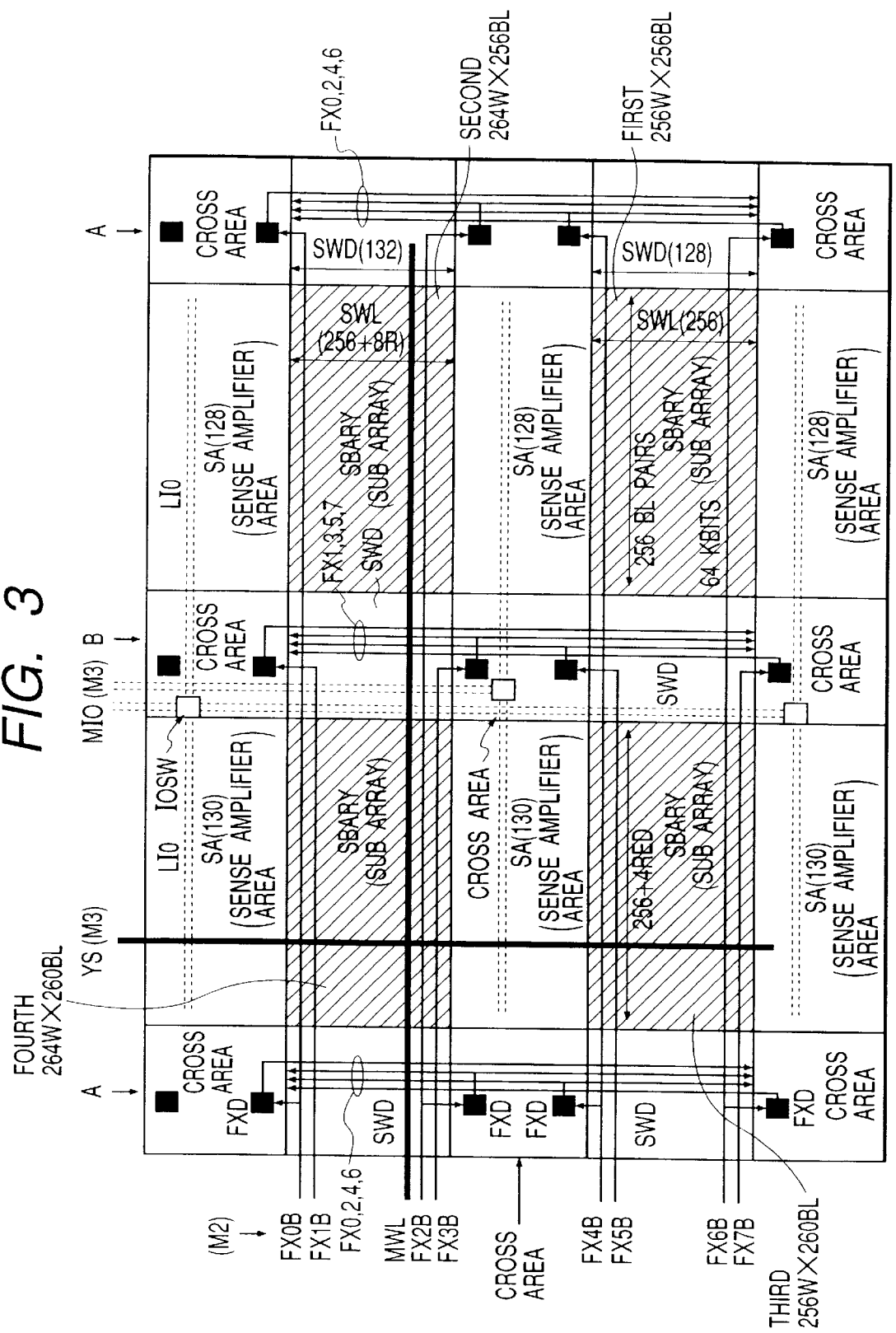
FIG. 3 is a layout diagram showing an embodiment of subarrays and associated peripheral circuits of the inventive dynamic RAM.

FIG. 3 shows in brief an embodiment of the layout of subarrays and associated peripheral circuits of the inventive dynamic RAM. Shown in this figure are four subarrays SBARY out of the subarrays shown in FIG. 2. In FIG. 3, the areas where subarrays SBARY are formed are indicated by hatching so as to be distinguished from the surrounding sub word driver areas, sense amplifier areas and cross areas.

Subarrays SBARY fall into four types as follows, although no limitation is imposed on the invention in this regard. With the word lines running horizontally, for example, the first subarray SBARY located at the bottom right corner has 256 sub word lines SWL and 256 pairs of complementary bit lines. Sub word drivers SWD of 256 in number corresponding to the 256 sub word lines SWL are laid out by being divided into two groups each including 128 lines on the right and left of the subarray. Sense amplifiers SA of 256 in number corresponding to the 256 pairs of complementary bit lines and having the shared sensing scheme mentioned previously are disposed alternately by being divided into two groups each including 128 amplifiers above and below the subarray.

The second subarray SBARY located at the top right corner has 256 regular sub word lines SWL, eight spare (redundant) sub word lines, and 256 pairs of complementary bit lines, although no limitation is imposed on the invention with regard to these numbers. Sub word drivers SWD of 264 in number corresponding to the 256 plus 8 sub word lines SWL are laid by being divided into two groups each including 132 lines on the right and left of the subarray. Sense amplifiers are disposed by being divided into two groups each including 128 amplifiers above and below the subarray. Among the 256 pairs of complementary bit lines of the subarrays SBARY located at the top right and bottom right corners, 128 pairs of complementary bit lines are connected commonly to the interposing sense amplifier SA through shared switch MOSFETS.

The third subarray SBARY located at the bottom left corner has 256 sub word lines SWL as in the case of the subarray SBARY located on its right-hand side, and two divided sets of 128 sub word drivers are disposed in the same fashion. Among the 256 sub word lines of the subarrays SBARY located at the bottom right and bottom left corners, 128 lines are connected commonly to 128 sub word drivers SWD which are formed in the area between these subarrays. The subarray SBARY located at the bottom left corner has 256 pairs of regular complementary bit lines BL and four pairs of spare (redundant) bit lines (4RED) Accordingly, 260 sense amplifiers SA corresponding to the 260 pairs of complementary bit lines BL are disposed by being divided into two groups each including 130 amplifiers above and below the subarray.

The fourth subarray SBARY located at the top left corner has 256 regular sub word lines SWL and eight spare sub word lines as in the case of the subarray SBARY located on its right-hand side, and 256 pairs of regular complementary bit lines and four pairs of spare bit lines as in the case of the subarray SBARY located below it. Two divided sets of 132 sub word drivers SWD are disposed on the right and left of the subarray, and two divided sets of 130 sense amplifiers SA are disposed above and below it correspondingly.

Each subarray SBARY is provided with spare sub word lines and spare complementary bit lines so that it can recover from defects by itself, and if a defect is irrecoverable by use of these spare sub word lines and complementary bit lines, it is recovered eventually by the redundant subarray mentioned previously. As an alternative arrangement, regular subarrays have only regular sub word lines and complementary bit lines, and they are recovered based on the replacement with spare sub word lines and spare complementary bit lines provided for the redundant subarray.

The main word lines MWL run horizontally as shown by a representative one, while the column select lines YS run vertically as shown by a representative one. The sub word lines SWL are laid in parallel to the main word lines MWL, and the complementary bit lines BL (not shown) are laid in parallel to the column select lines YS.

For the four subarrays, eight sub word select lines FX0B-FX7B extend by running through the four sets (eight pieces) of subarrays in the same fashion as the main word lines MWL. Specifically, two groups of four sub word select lines FX0B-FX3B and FX4B-FX7B run by being divided above and below the upper and lower subarrays. The reason for the allotment of one set of sub word select lines FX0B-FX7B to two subarrays and their layout over the subarrays is to make the chip size smaller.

If, otherwise, eight sub word select lines FX0B-FX7B are allotted to each subarray and formed in the wiring channels in the sense amplifier area, the 32 sense amplifiers aligned in the lateral direction of the memory array of FIG. 1 would necessitate a large number of wiring channels, such as 256 (8×32). Whereas, the foregoing embodiment of this invention is designed to allot the eight sub word select lines FX0B-FX7B to two upper and lower subarrays, they are laid out over the subarrays in parallel to and by being mixed with the main word lines, thereby eliminating the need for exclusive wiring areas.

One main word line is laid in correspondence to eight sub word select lines over the subarrays, and sub word select lines are needed to select one of the eight sub word lines. Since the main word lines MWL are formed at a proportion of one for every eight sub word line SWL, which is formed at the pitch of memory cells, the wiring pitch of the main word lines MWL is relaxed significantly. On this account, it is relatively easy to form the sub word select lines by utilizing the wiring layer for the main word lines MWL and by slightly sacrificing their relaxed wiring pitch.

The sub word driver SWD of this embodiment is designed to select a sub word line SWL by using a selection signal supplied through the sub word select lines FX0B-FX7B and the signal of inverted version. It is also designed to select a sub word line SWL of the subarrays located on its right-hand and left-hand sides.

With a sub word select line running in parallel to the main word lines MWL being called a first sub word select line FX0B, there is provided a second sub word select line FX0 which feeds a selection signal to the above-mentioned 64 sub word drivers aligned in the upper and lower stages through a sub word select line drive circuit FXD which is disposed in the cross area at the top left corner and adapted to receive a selection signal over the first sub word select line FX0B. The first sub word select line FX0B runs in parallel to the main word line MWL and sub word line SWL, whereas the second sub word select line runs in the sub word driver area in parallel to the column select line YS and complementary bit lines BL orthogonal to the main word line MWL. Similar to the eight first sub word select lines FX0B-FX7B, the second sub word select lines FX0-FX7 are laid distributively to the sub word drivers SWD located on both sides of the subarrays SBARY by being divided into even-numbered lines FX0, FX2, FX4 and FX6 and odd-numbered lines FX1, FX3, FX5 and FX7.

The sub word select line drive circuits FXD are arranged such that a set of two circuits FXDs are located at the upper and lower positions of each cross area as shown by small solid squares in FIG. 3 specifically, the lower sub word select line drive circuit FXD in the cross area at the top left corner corresponds to the first sub word select line FX0B, the two sub word select line drive circuits FXD in the cross area at the left extreme of the middle stage correspond to the first sub word select lines FX2B and FX4B, and the sub word select line drive circuit FXD in the cross area at the bottom left corner corresponds to the first sub word select line FX6B. The lower sub word select line drive circuit FXD in the cross area at the top center corresponds to the first sub word select line FXLB, the two sub word select line drive circuits FXD in the cross area at the center of the middle stage correspond to the first sub-word select lines FX3B and FX5B, and the sub word select line drive circuit FXD in the cross area at the bottom center corresponds to the first sub word select line FX7B.

The lower sub word select line drive circuit FXD in the cross area at the top right corner corresponds to the first sub word select line FX0B, the two sub word select line drive circuits FXD in the cross area at the right extreme of the middle stage correspond to the first sub word select lines FX2B and FX4B, and the sub word select line drive circuit FXD in the cross area at the bottom right corner corresponds to the first sub word select line FX6B. The sub word drivers located at the end of memory arrays have no subarrays on their right-hand side and accordingly drive only the sub word lines SWL on their left-hand side.

The arrangement of sub word select lines FXB within the marginal space of the main word lines MWL over the subarrays according to this embodiment does not necessitate wiring channels for the lines FXB, and therefore arranging eight sub word lines for each subarray does not result in an increased chip size. However, it requires an increased size of cross areas for the formation of the sub word select line drive circuits FXD, which precludes the intention of higher density integration. The cross areas are already used up for the disposition of peripheral circuits including the I/O switch circuits for the main input/output lines MIO and local input/output lines LIO which are shown by dashed lines, the sense amplifier driving power MOSFETS, the shared switch MOSFET drive circuits, the precharge MOSFET drive circuits, etc. Therefore, the embodiment shown in FIG. 3 is designed so that one sub word select line drive circuit FXD is shared by two upper and lower subarrays, thereby minimizing an increase of the area.

Among these cross areas, those located along the running direction A of the even-numbered second sub word select lines FX1–FX6 have the disposition of n-channel power MOSFETs Q14 and Q15 for supplying the ground voltage VSS and power voltage VDD, respectively, to the sense amplifiers, as will be explained in detail later, although no limitation is imposed on the invention in this regard.

Among these cross areas, those located along the running direction B of the odd-numbered second sub word select lines FX1-FX7 have the disposition of inverter circuits for cutting off the bit line precharging and equalizing MOSFETs and n-channel power MOSFETs for supplying the ground voltage VSS to the sense amplifiers, although no limitation is imposed on the invention in this regard. These n-channel power MOSFETs located on both sides of the sense amplifiers are used to supply the ground voltage to the common source line CSN of the n-channel amplifying MOSFETs which form the sense amplifiers. Accordingly, the sense amplifiers of 128 or 130 in number disposed the sense amplifier area are supplied with the ground voltage by both the n-channel power MOSFETs in the cross areas along the A direction and the n-channel power MOSFETs in the cross areas along the B direction.

The sub word line drive circuits SWD select sub word lines of the subarrays located on both sides thereof. In response to the two selected subarray sub word lines, two sense amplifiers on both sides are activated. This rewrite operation by the activation of sense amplifiers is intended to restore the changing states of the storage capacitors which have intermingled with the changes of the bit lines through the address selecting MOSFETs which have been made conductive by the selected sub word lines. The above-mentioned power MOSFETS, except for those corresponding to the subarrays located at the ends, are used to activate the sense amplifiers on both sides thereof. The sub word line drive circuits SWD on the right or left of the subarrays located at the ends select only sub word lines of their adjoining subarrays, and accordingly they activate only the sense amplifiers for the subarrays on one side thereof.

The sense amplifier, which is based on the shared sensing scheme, amplifies the readout signal on the complementary bit lines corresponding to the selected sub word line following the cutoff of the shared switch MOSFETs for the complementary bit lines on the side of the unselected sub word line so that the other subarray is disconnected, thereby rewriting the memory cell by restoring the changing state of the storage capacitor.

Figure 4:
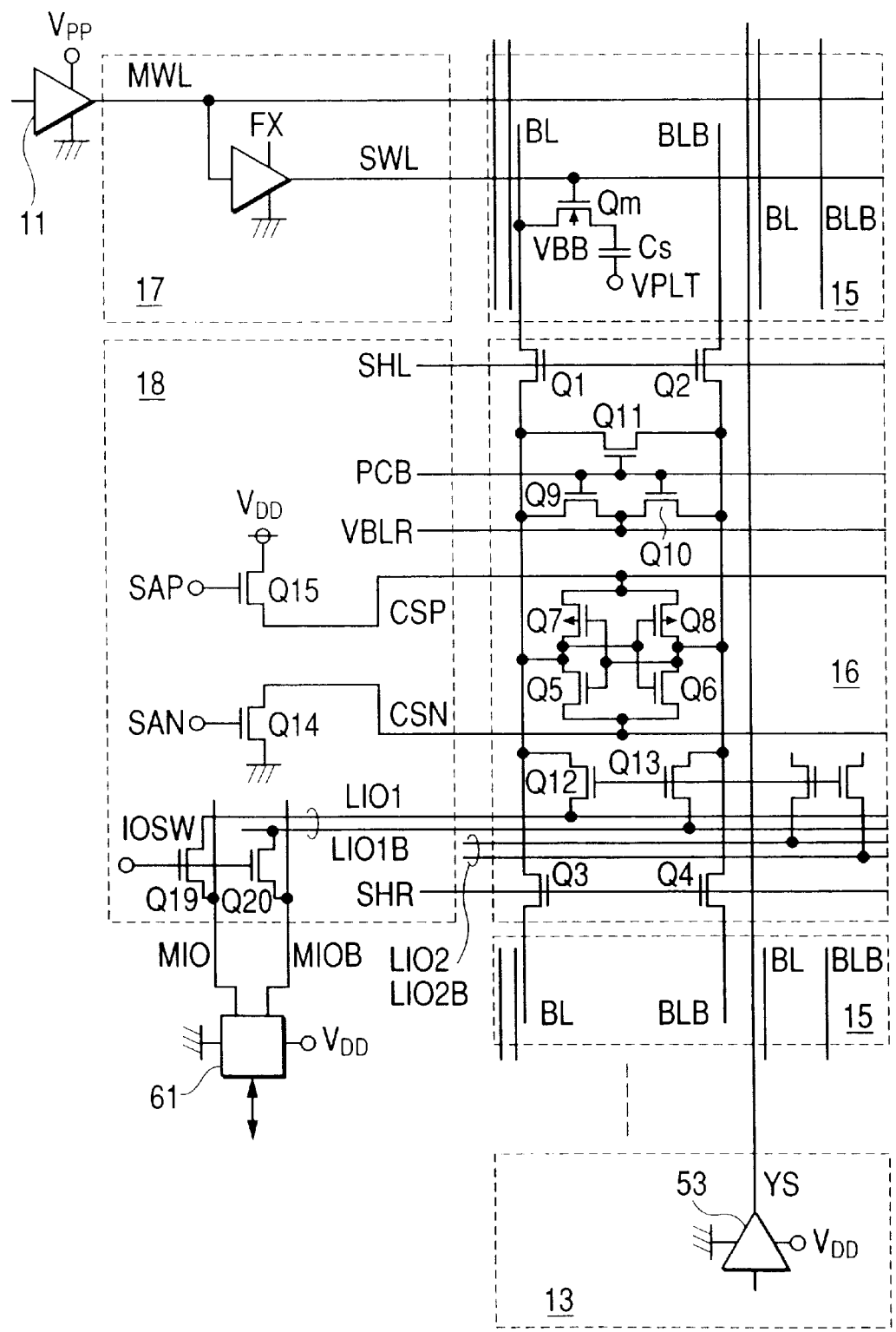
FIG. 4 is a schematic diagram showing an embodiment of the dynamic RAM, with the sense amplifier section and its periphery being simplified.

FIG. 4 shows schematically an embodiment of the dynamic RAM, with the sense amplifier section and its periphery being simplified. The figure shows a specific circuit arrangement of a sense amplifier 16 located between two upper and lower subarrays 15 and of associated circuits formed in a cross area 18, with other circuitry being shown as blocks.

The term "MOS" stands for metal oxide semiconductor, however, it is recently used more widely to generally designate semiconductor devices in which substantial metallic portions are replaced with a non-metallic electrical conductor, such as poly-silicon or oxide being replaced with another insulator. The term "CMOS" is also becoming technically comprehensive in accordance with the term MOS. The term "MOSFET" is now also used widely even to signify insulated gate field effect transistors. These terms "CMOS", "MOSFET", etc. used in the description of the present invention are compatible with their contemporary usage.

The dynamic memory cell is representative of one which is located in a subarray 15 and disposed between a sub word line SWL and one bit line BL of a complementary bit lines pair BL and BLB. The dynamic memory cell consists of an address selecting MOSFET Qm and a storage capacitor Cs. The address selecting MOSFET Qm has its gate connected to the sub word line SWL, its drain connected to the bit line BL, and its source connected to the storage capacitor Cs. The storage capacitor Cs has its other electrode supplied with a plate voltage VPLT commonly to other storage capacitors. The substrate (channel) of the address selecting MOSFET Qm has a negative back-bias voltage VBB applied thereto. The sub word line SWL has a high selection level VPP which is equal to the high level of the bit line added to the threshold voltage of the address selecting MOSFET Qm.

In case the sense amplifier is operated at such a power voltage VDD as 1.8 volts, the amplified high-level output of the sense amplifier placed on the bit line is clamped to this internal voltage VDD. Accordingly, the high voltage VPP of the selection level of the word line is VDD plus Vth plus $\alpha$ ($\alpha$ is around 3.6 volts).

The complementary bit lines BL and BLB located on the left of the sense amplifier are laid to run in parallel to each other as shown and cross each other appropriately so as to balance the capacitance of the bit lines. The complementary bit lines BL and BLB are connected to the input/output nodes of the sense amplifier unit circuit by shared switch MOSFETs Q1 and Q2.

The sense amplifier unit circuit is made up of n-channel amplifying MOSFETs Q5 and Q6 and p-channel amplifying MOSFETs Q7 and Q8 having their gates and drains connected crisscross in latch configuration. The n-channel MOSFETs Q5 and Q6 have their sources connected to a common source line CSN, while the P-channel MOSFETs Q7 and Q8 have their sources connected to another common source line CSP. These source lines CSN and CSP are connected to respective power switch MOSFETS. The common source line CSN connected with the sources of the n-channel amplifying MOSFETs Q5 and Q6 is supplied with an operation voltage which is related to the ground voltage by an n-channel power switch MOSFET Q14 formed in the cross area 18, although no limitation is imposed on the invention in this regard.

Similarly, the common source line CSP connected with the sources of the p-channel amplifying MOSFETs Q7 and Q8 is provided with an n-channel power switch MOSFET Q15 formed in the cross area 18, although no limitation is imposed on the invention in this regard. For the over-drive operation of the sense amplifiers, a voltage which is stepped up from the power voltage VDD by an internal circuit may be used. Specifically, the stepped-up voltage produced by the internal circuit may be supplied to the sense amplifiers temporarily only during their start-up period based on the additional provision of an n-channel power MOSFET.

In order to alleviate the dependency of the sense amplifier operation speed on the power voltage VDD, an alternative power system operates to apply a stepped-up voltage VPP to the gate, connect the drain to the power voltage VDD, and use the voltage which is slightly lower then the power voltage VDD for the operation voltage of the sense amplifier. The n-channel power switch MOSFET Q15 is supplied on its gate with a sense amplifier activating signal SAP, which has a high level of the stepped-up voltage VPP so that the MOSFET Q15 is made conductive by the voltage VPP to produce the voltage VDD, although no limitation is imposed on the invention in this regard.

Provided on the input/output nodes of the sense amplifier unit circuit are an equalizing MOSFET Q11 which short-circuits the complementary bit lines, and a precharging circuit consisting of switch MOSFETs Q9 and Q10 for supplying a precharge voltage VBLR to the complementary bit lines. These MOSFETs Q9–Q11 have their gates supplied commonly with a precharge signal PCB. An inverter circuit is formed (not shown) in the cross area so that a drive circuit produces the precharge signal PCB with a sharp falling edge.

Namely, it is intended to switch the MOSFETs Q9–Q11 of the precharging circuits through the inverter circuits provided distributively in the cross areas in advance of the word line selection timing at the beginning of memory access. The cross area 18 may include when necessary, in addition to the circuits shown in FIG. 4, half precharging circuits for the common source lines CSP and CSN of the sense amplifiers, half precharging circuits for the local input/output lines LIO, and distributed-driver circuits for the shared selection signal lines SHR and SHL.

The sense amplifier unit circuit is connected through shared switch MOSFETs Q3 and Q4 to the complementary bit lines BL and BLB of the subarray 15 shown at the bottom of the figure. Switch MOSFETs Q12 and Q13, which constitute a column switch circuit, become conductive when the selection signal YS goes high (select level), thereby connecting the input/output nodes of the sense amplifier unit circuit to local input/output lines LIO1 and LIO1B. For example, when the sub word line SWL of the upper subarray is selected, the shared switch MOSFETs Q1 and Q2 above the sense amplifier are kept conductive, while the shared switch MOSFETs Q3 and Q4 below the sense amplifier are cutoff.

In consequence, the sense amplifier has its input/output nodes connected to the upper complementary bit lines BL and BLB, amplifies a small signal from a memory cell that is connected to the selected sub word line SWL, releases the resulting signals to the local input/output lines LIO1 and LIO1B through the column switch circuit (Q12 and Q13). The local input/output lines LIO1 and LIO1B are connected to the main input/output lines MIO and MIOB through a switch circuit IOSW formed of n-channel MOSFETs Q19 and Q20 in the cross area 18. The MOSFETs Q19 and Q20 may be provided with p-channel MOSFETs connected in parallel to them (not shown) so that the switch circuit IOSW works as a so-called analog gate which (operates much faster. Connected to the main input/output lines MIO and MIOB are the input terminal of the main amplifier MA and the output terminal of the write amplifier WA which are included in the read/write circuit 61.

The column switch circuit operates in response to a selection signal YS to connect pairs of complementary bit lines BL and BLB to the corresponding pairs of local input/output lines LIO1 and LIO1B, LIO2 and LIO2B, and so on. Accordingly, for each subarray which is selected by the selecting operation of one main word line, pairs of complementary bit lines are selected by the pairs of column switch circuits provided in correspondence to a pair of sense amplifiers located on both sides of the subarray. In this manner, 72-bit wide memory access is made possible for each of the divided memory arrays located on the right and left as shown in FIG. 1.

The main amplifier MA and write amplifier WA included in the read/write circuit 61 transact data with a SRAM macro. Specifically, read/write unit circuits of 288 in number are divided in half into an upper and lower groups, and data is transferred in two cycles, 144 bits at a time, to/from a SRAM macro.

Figure 5:
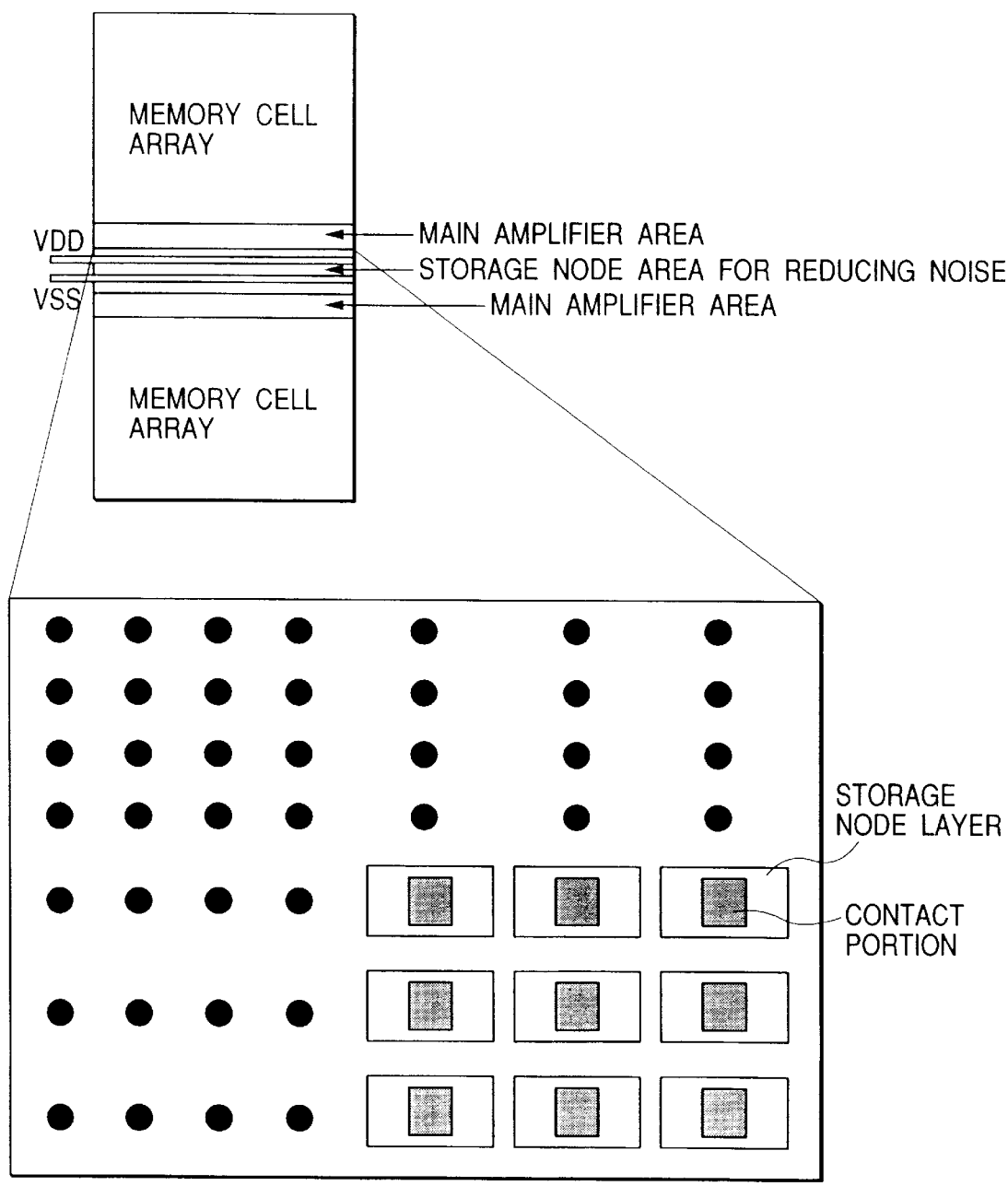
FIG. 5 is a layout diagram showing a semiconductor integrated circuit device incorporating a dynamic RAM based on another embodiment of this invention.

FIG. 5 shows in brief the layout of the semiconductor integrated circuit device incorporating a dynamic RAM based on an embodiment of this invention. Shown in the figure are memory arrays which are a quarter of the memory array section of FIG. 1. Each memory array is made up of 4-by-9 subarrays as shown by enlargement in FIG. 2. A group of subarrays constitute two memory cell arrays, with a main amplifier section and noise suppressing storage node area being provided between them.

The main amplifier section includes main amplifiers MA, write amplifiers WA and read/write control circuits RWC, as described previously, and there is further provided a common noise suppressing storage node area between the power lines for supplying the operation voltage VDD and ground voltage VSS to the circuits. Specifically, noise suppressing capacitors are provided for the VDD power line and VSS ground line which reach to the main amplifiers MA, write amplifiers WA and read/write control circuits RWC.

The noise suppressing capacitor comprises a number of capacitors having the same storage node layers as of the information capacitors of dynamic memory cells. The storage node layers are connected commonly through a contact section to a diffusion layer formed on the semiconductor substrate surface. The storage node layer has on its surface the formation of an insulation film (dielectric film) of $Ta_2O_5$ or the like, on which a plate electrode is formed commonly to multiple storage node layers. Namely, a number of information storage capacitors for memory cells are connected in parallel to have a relatively large capacitance and adapted to absorb noises arising at the operation of the main amplifiers MA, write amplifiers WA and read/write control circuits RWC.

Figure 6:
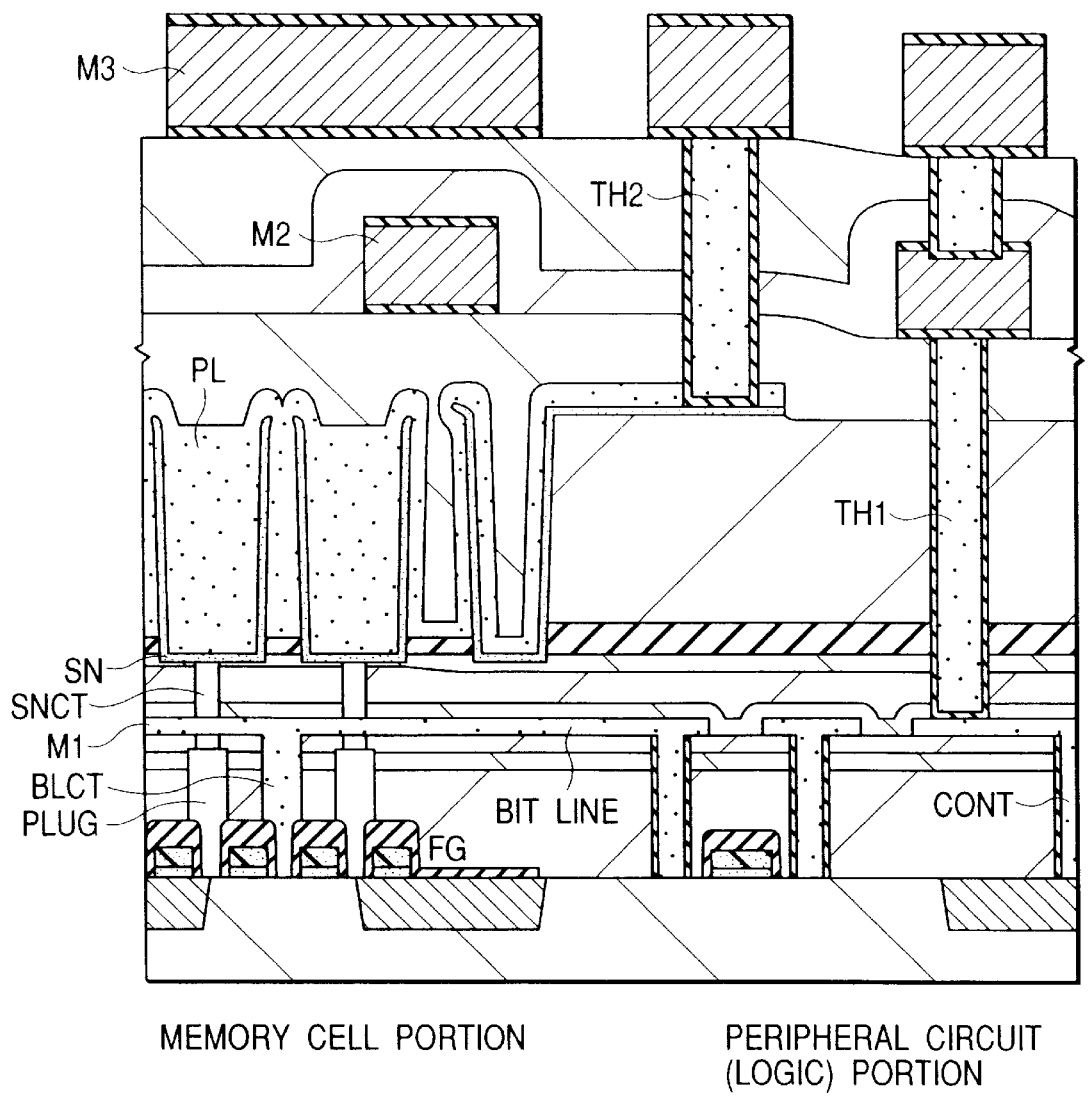
FIG. 6 is a cross-sectional diagram showing an embodiment of the dynamic memory cell and associated peripheral circuit (logic circuit) section.

FIG. 6 shows in brief the cross-sectional structure of an embodiment of the dynamic memory cell and its peripheral circuit section (logic circuit). The storage capacitor of a memory cell is of the so-called concave crown type, with its plate electrode PL being formed through a storage node SN of poly-silicon layer and an insulation film (dielectric film) of $Ta_2O_5$ or the like. The storage node SN is connected to one source-drain of the address selecting MOSFET through a storage contact SNCT of tungsten W or the like and a plug PLUG made of a poly-silicon layer.

The address selecting MOSFET has another source-drain, which is made common to two memory cells, connected to the bit line which is the first metallic layer M1 through a bit line connecting section BLCT. The bit line M1 is made of a metallic material such as tungsten W. The gate electrode of the MOSFET is formed of the first poly-silicon layer FG as part of the sub word line.

The MOSFETs of the peripheral circuit (logic circuit) section are designed to have a thinner gate insulation film as compared with the address selecting MOSFETS, although no limitation is imposed on the invention in this regard, so that the circuit has a lower threshold voltage thereby to operate fast for input signals with a small amplitude produced from such a low VDD power voltage as 1.8 volts. In contrast, the address selecting MOSFETs of memory cells are designed to have such a higher threshold voltage as about 1.8 volts by having a thicker gate insulation film and by having a negative back-bias voltage VBB applied in the well region where the MOSFETs are formed, so that the off-state leakage current decreases thereby to allow small storage capacitors to hold information charges much longer.

FIGS. 7(A), 7(B) and 7(C) show the cross-sectional structure of examples of the noise suppressing capacitor used in accordance with this invention. The capacitor is basically the same as the foregoing storage capacitor of the memory cell shown in FIG. 6. Particularly, the plate electrode PL, dielectric film and storage node SN have the same structure as the former capacitor. The storage contact SNCT and plug PLUG are given large diameters in order to reduce the parasitic resistance on the part of the storage node SN. FIGS. 7(A) to 7(C) show three examples of the storage contact SNCT and plug PLUG which are designed to have larger diameters.

In the example of FIG. 7(A), the plug PLUG which makes the electrical connection with the $n^+$ diffusion layer is made common to the storage nodes SN aligned in the X direction in the figure. The storage contact SNCT which connects the plug PLUG to the storage node SN is separated for individual storage nodes SN, and, in contrast to the storage capacitor of the memory cell, its diameter is increased up to the bottom diameter of the storage node SN.

In the example of FIG. 7(B), the plug PLUG which makes the electrical connection with the $n^+$ diffusion layer and also the storage contact SNCT which connects the plug PLUG to the storage node SN are made common to the storage nodes SN aligned in the X direction in the figure. It is apparent from the cross-sectional view of FIGS. 7(A) and 7(B) taken along the Y direction that the storage nodes SN aligned in the X direction and the corresponding storage contact SNCT and plug PLUG are each arranged by being separated from those adjacent in the Y direction. Increasing the diameter of the storage contact SNCT and plug PLUG which join the storage nodes of capacitors reduces the parasitic resistance of this portion, thereby enhancing the ability of absorption to cover high frequency noises.

In the example of FIG. 7(C), the storage contact SNCT and plug PLUG are formed by being separated from each other in correspondence to the storage nodes SN. A difference in structure of these members from those of the storage capacitor is their increased diameter which is as large as the bottom diameter of the storage node SN. Although the increased diameter of the storage contact SNCT and plug PLUG adopted in the examples of FIGS. 7(A) to 7(C), which is made possible by the absence of the bit line connecting section BLCT which is needed in the case of the memory cell, is desirable for the enhanced noise absorption resulting from the decreased parasitic resistance, this condition is not indispensable for the noise suppressing capacitor that the present invention is concerned with. Instead, the structure of the foregoing storage capacitor as shown in FIG. 6 may be used intact, with multiple capacitors being connected in parallel by the $n^+$ diffusion layer.

Figure 8:
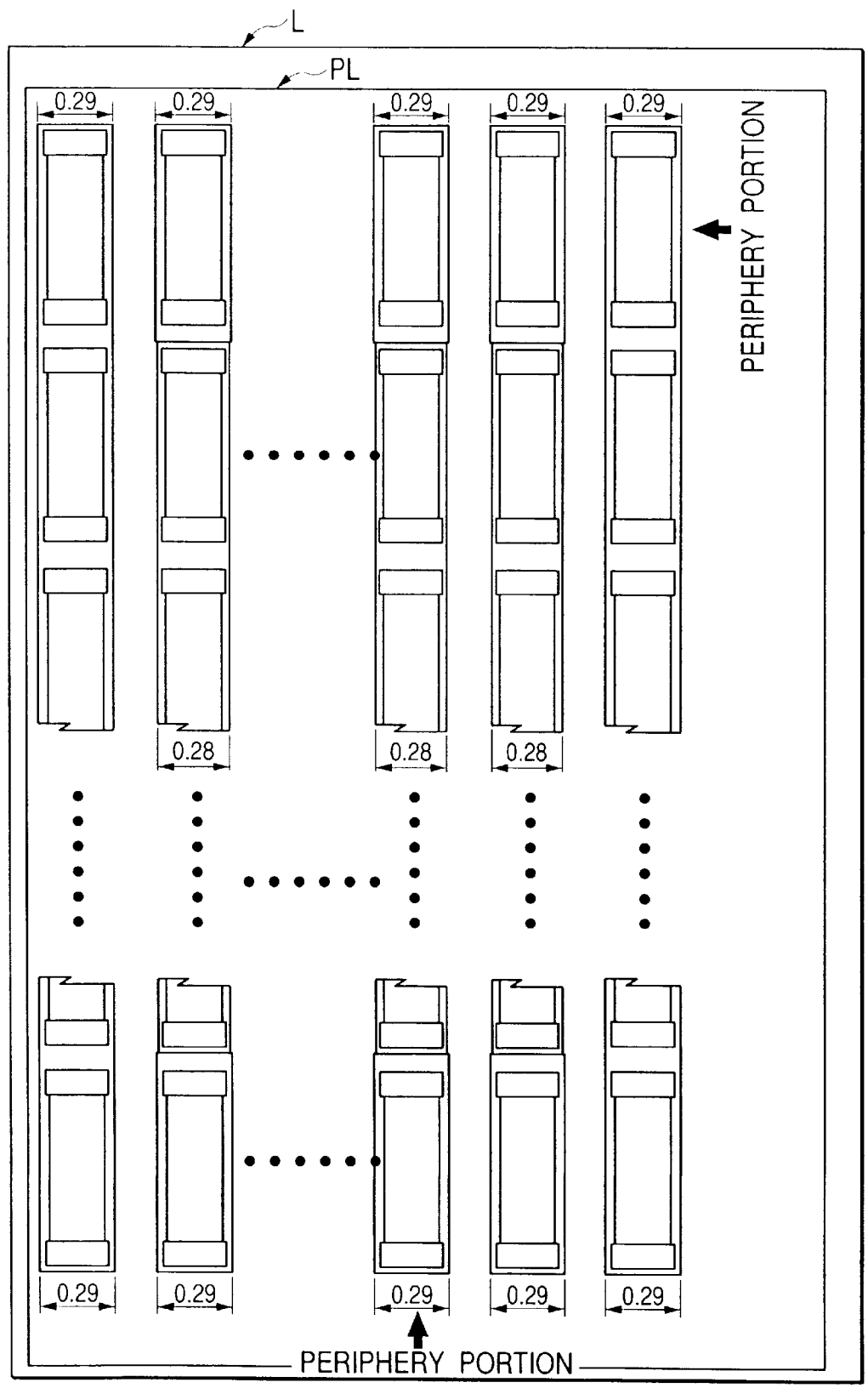
FIG. 8 is a plan view of an embodiment of the noise suppressing capacitor used in this invention.

FIG. 8 shows in brief a plan view of an embodiment of the noise suppressing capacitor used in this invention. This plan view is taken to match with the cross-sectional views of FIGS. 7(A) and 7(B). Elements located in the periphery of capacitors are formed to be slightly larger in size. Specifically, in case storage contacts SNCT and plugs PLUG in addition are made common to storage nodes SN, these elements located at the upper and lower extremes and the right and left extremes are formed to have a slightly larger size with the intention of compensating the dullness of an element pattern created during the semiconductor photolithographic process.

The multiple storage nodes SN are connected in parallel to become one electrode by the diffusion layer L which is formed on the side of the semiconductor substrate, and a plate electrode PL is formed correspondingly to become another electrode. In this manner, storage capacitors of dynamic memory cells each having a small capacitance are utilized to form by parallel connection a capacitor having such a relatively large capacitance as to be able to absorb power noises.

Figure 9:
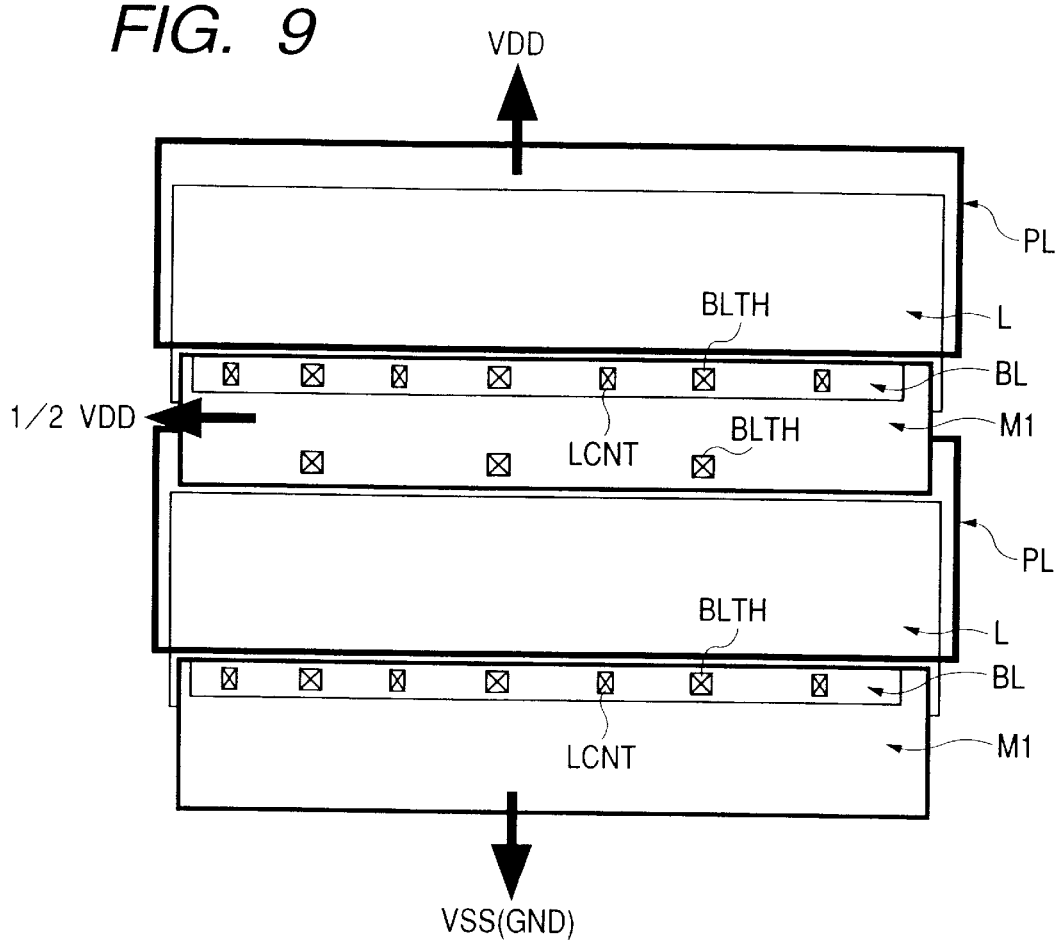
FIG. 9 is a plan view of another embodiment of the noise suppressing capacitor used in this invention.

FIG. 9 shows in brief a plan view of another embodiment of the noise suppressing capacitor used in this invention. The storage capacitor of dynamic memory cell has its plate electrode PL applied with a voltage which is half the sense amplifier operation voltage VDD. Accordingly, the storage capacitor, in which is written data at a high-level voltage related to the power voltage VDD and a low-level voltage of the ground voltage VSS, has applied thereto only a half the VDD voltage. If this storage capacitor is used intact for the power noise suppressing capacitor which has a full VDD voltage applied thereto, there can possibly arise a question of durability.

This embodiment is designed to couple two capacitors in series so that each capacitor has only a half the VDD voltage applied thereto. Specifically, the diffusion layer L constitutes another electrode of the first capacitor, i.e., the plate electrode PL to be supplied with the power voltage VDD, is connected to the wiring layer for the bit line BL by the contact LCNT, and the wiring layer of BL and the first metallic layer M1 are connected together by through-holes BLTH. The second capacitor has its plate electrode PL connected to the first metallic layer M1 through through-holes BLTH. The diffusion layer L for another electrode of the second capacitor is connected to the wiring layer of the bit line BL by the contact LCNT, with the ground voltage VSS of the circuit being supplied to the wiring layer BL. By supplying a half the VDD voltage to the connection node of two capacitors, as shown in FIG. 9, the application voltage of both capacitors can be kept at a half the VDD voltage, whereby the reliability of these capacitors can further be enhanced.

Accordingly, based on the serial connection of two capacitors, such capacitors with a low withstand voltage as storage capacitors of dynamic memory cells can be used for the noise suppressing capacitors connected between the lines of power voltage VDD and ground voltage VSS of the circuit.

Figure 10:
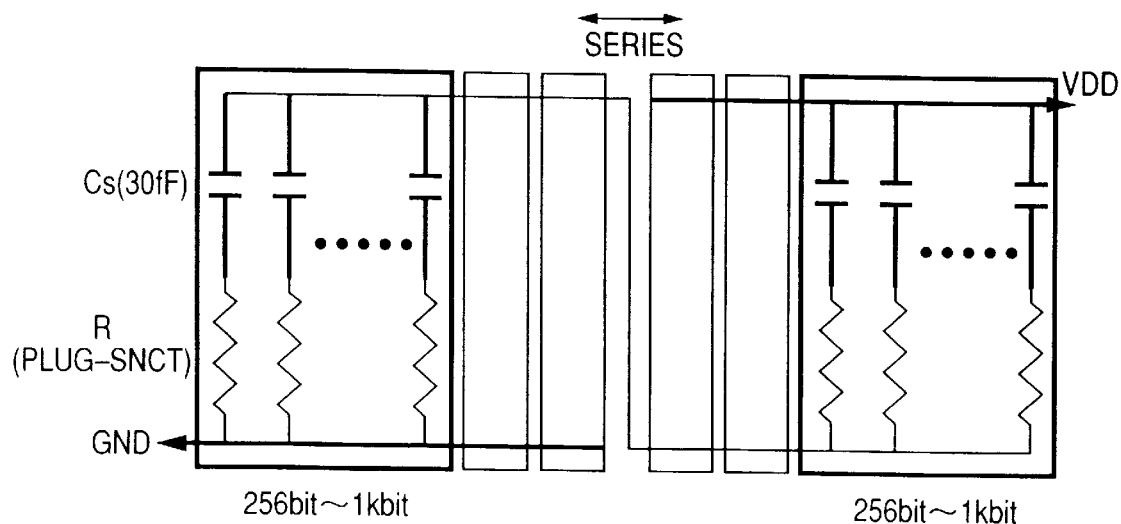
FIG. 10 is a diagram showing an equivalent circuit of the noise suppressing capacitors shown in FIG. 9.

FIG. 10 shows an equivalent circuit of the noise suppressing capacitors shown in FIG. 9. For a subarray of 256-by-256 bits, for example, 256 memory cells are connected to one sub word line. Accordingly, by using the region where sub word lines are formed in correspondence to a subarray, a capacitance provided by 256 storage capacitors connected in parallel can be created. The sub word lines are grouped and multiple groups of lines are connected in parallel to form the above-mentioned first and second capacitors, which are connected in series between the lines of power voltage VDD and ground voltage VSS of the circuit.

Connecting a number of storage capacitors, each having such a small capacitance of about 30 fF, in parallel accomplishes a capacitance which is large enough to suppress relatively large noises arising on the power lines of VDD and VSS at the operation of the main amplifiers MA and write amplifiers WA. Resistors R shown on the side of the storage node represent the parasitic resistance of the storage contact SNCT and plug PLUG.

Figure 11:
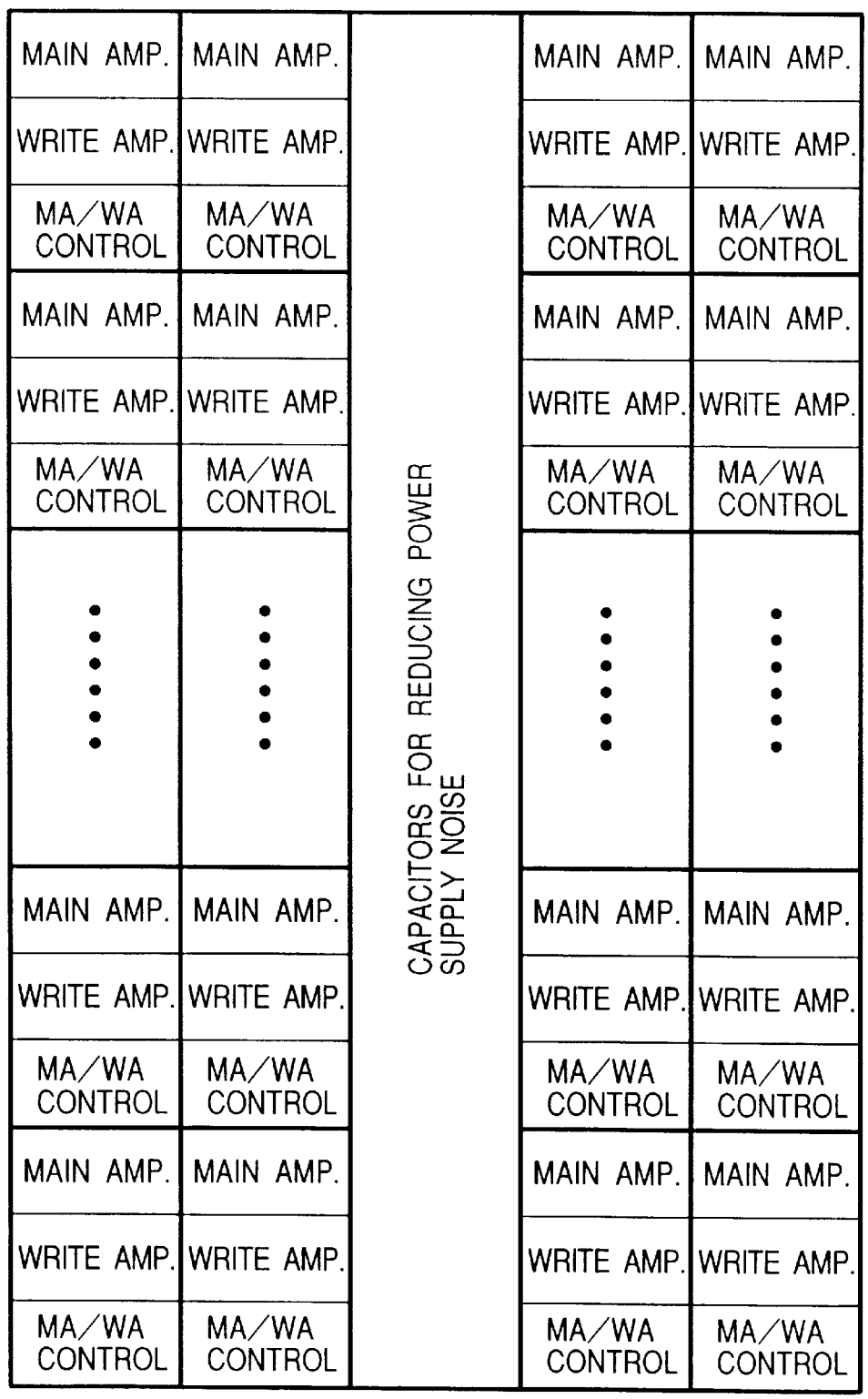
FIG. 11 is a layout diagram of an embodiment of the main amplifier section shown in FIG. 1.

FIG. 11 shows a plan view of an embodiment of the main amplifier section. The main amplifiers and memory array are formed in a line symmetry fashion on both sides of the power noise suppressing capacitors located at the center as shown in FIG. 1.

In a main amplifier section, a main amplifier (Main Amp) write amplifier (Write Amp) and associated control circuit (MA/WA Control) are paired, and multiple pairs of these circuits are aligned in two stages. Placing the power noise suppressing capacitors at the center of the main amplifier section between two divided memory arrays enables efficient noise absorption at a minimal occupancy area.

Figure 12:
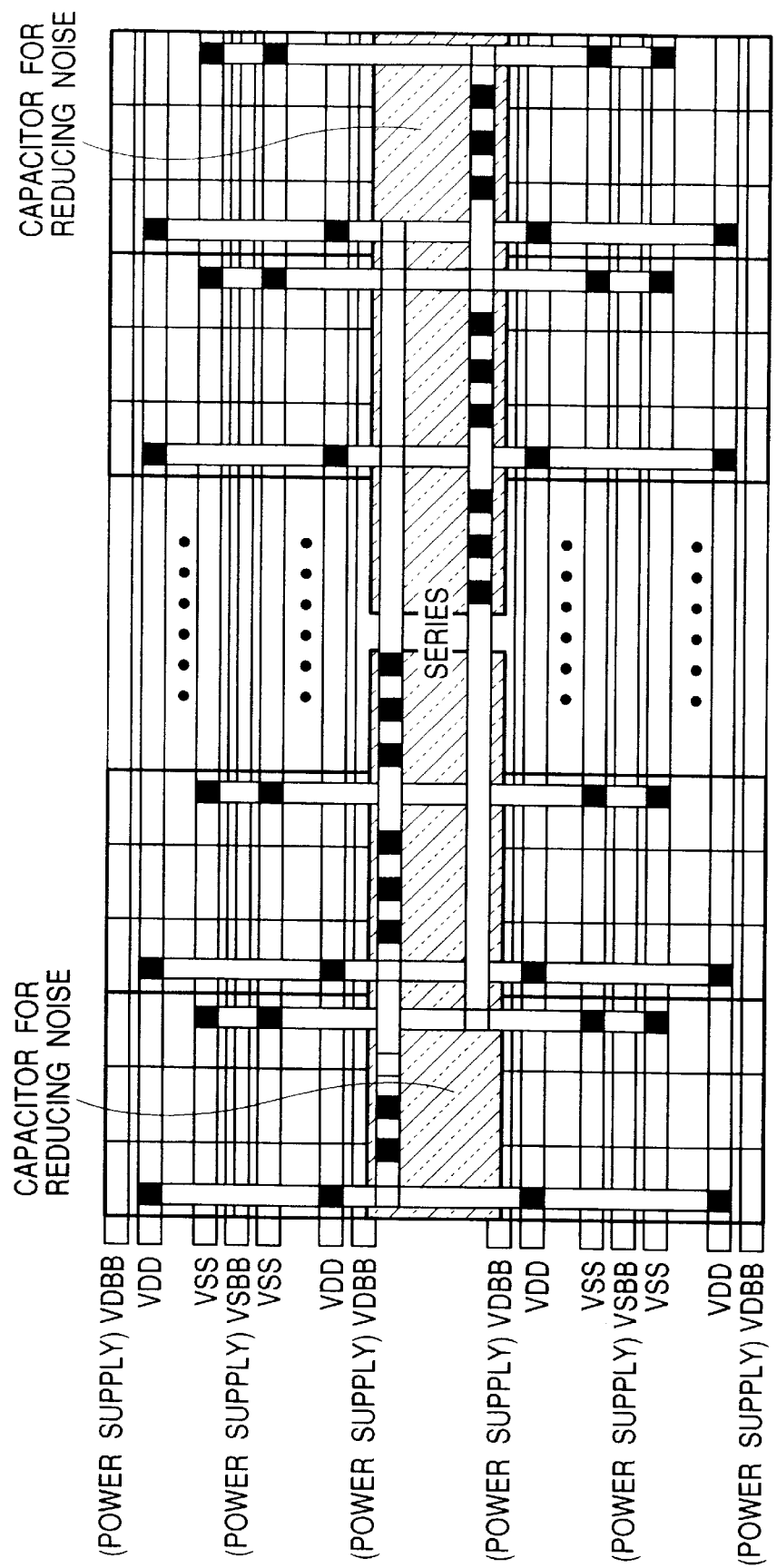
FIG. 12 is a plan view of the main amplifier section shown in FIG. 1.

FIG. 12 is another plan view showing mainly the power supply lines based on an embodiment of the main amplifier section. Two pairs of power supply lines of VDD and VSS are laid to run along the two-stage main amplifiers, write amplifiers and control circuits. This embodiment is intended to reduce the power consumption in data hold mode based on the provision of back-bias voltage supply lines VDBB and VSBB in the n-well regions and p-well regions where p-channel MOSFETs and n-channel MOSFETS, respectively, of the main amplifiers, write amplifiers and control circuits are formed so that the sources and wells of MOSFETs are reversely biased, although no limitation is imposed on the invention in this regard. One back-bias voltage supply line VSBB runs at the center of the two stages so as to serve commonly to both stages, although no limitation is imposed on the invention.

When the semiconductor integrated circuit device is held in a halt mode, or in other words, when the dynamic RAM is not accessed for reading or writing, a back-bias voltage VDBB higher than the power voltage VDD is applied to the n-well regions and a negative voltage VSBB below the ground voltage of the circuit is applied to the p-well regions of the main amplifier section. Accordingly, the p-channel MOSFETs and n-channel MOSFETs have their sources and wells biased reversely, resulting in a higher threshold voltage by the substrate effect. In consequence, the sub-threshold leakage current (tailing current) flowing through the p-channel MOSFETs and n-channel MOSFETs in their off state can be reduced significantly to an extent of the order of one digit or more.

On the other hand, when the main amplifier section operates, i.e., when the dynamic RAM is accessed for reading or writing, the power voltage VDD and ground voltage VSS are applied to the n-well regions and p-well regions, respectively, of the main amplifier section. In consequence, the sources and wells of the p-channel MOSFETs and n-channel MOSFETs have the same potential, and the resulting lower thermistor voltage produces a large output current for a small input voltage, thereby accomplishing a fast read/write operation.

Two noise suppressing capacitors are formed and connected in series at the center of the main amplifier section. The first capacitor is connected to the power voltage VDD, while the second capacitor is connected to the ground voltage VSS of the circuit. These power lines of VDD and VSS, with the two serial capacitors being connected therebetween, are connected through wires, which run by being orthogonal to the power lines, to the VDD and VSS power lines of the two-stage main amplifier section.

The main amplifier section is formed in correspondence to the memory array in the case of using storage capacitors of dynamic memory cells, and the noise suppressing capacitors can also be formed similarly to the memory array on this account, based on the disposition of the main amplifier section between the divided memory arrays and the formation of the noise suppressing capacitors at its center by utilization of storage capacitors of dynamic memory cells, it becomes possible to form capacitors having a large capacitance efficiently in a small layout area.

Figure 13:
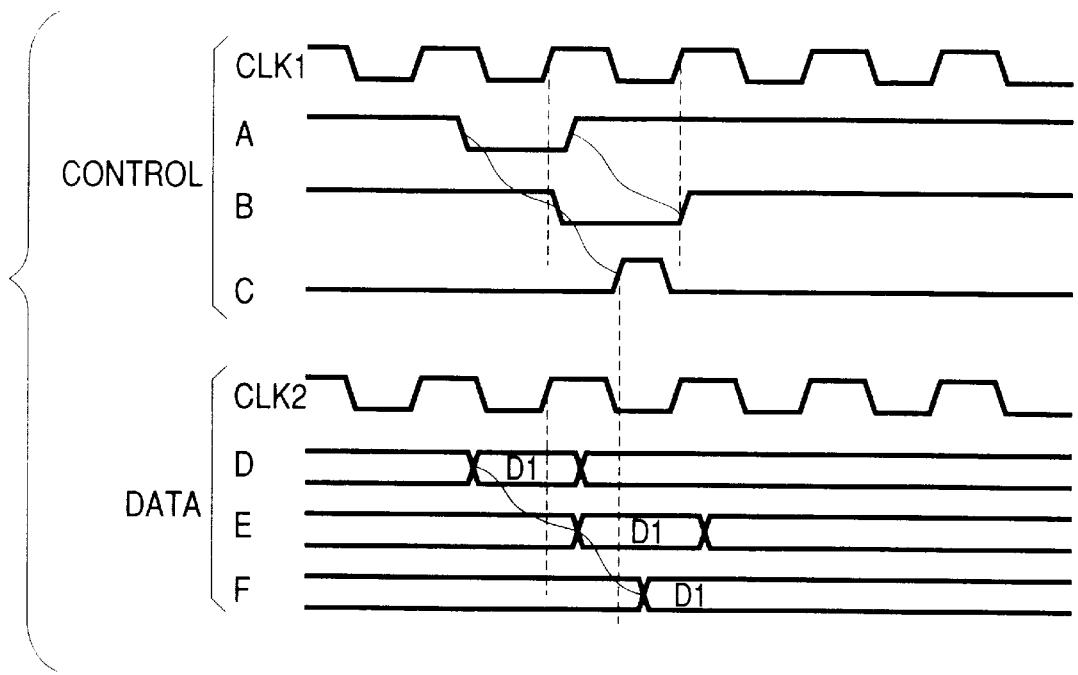
FIG. 13 is a timing chart used to explain an example of the write operation of the dynamic RAM section of the inventive semiconductor integrated circuit device.

FIG. 13 shows a timing chart which explains an example of the write operation of the dynamic RAM section of the inventive semiconductor integrated circuit device. Signals are shown as being divided into a control group and a data group. The control group includes a write amplifier clock signal CLK1, a clock latch signal A, a latched output signal B and a write pulse C produced from the signals A and B, and the data group includes a write data fetch clock CLK2, a write data D from the logic circuit (SRAM), a latched output signal E and write data F to be fed to memory cells. In operation, the clock CLK2 establishes data to be written, and the write pulse C of the control group releases write data F to be supplied to memory cells.

Figure 14:
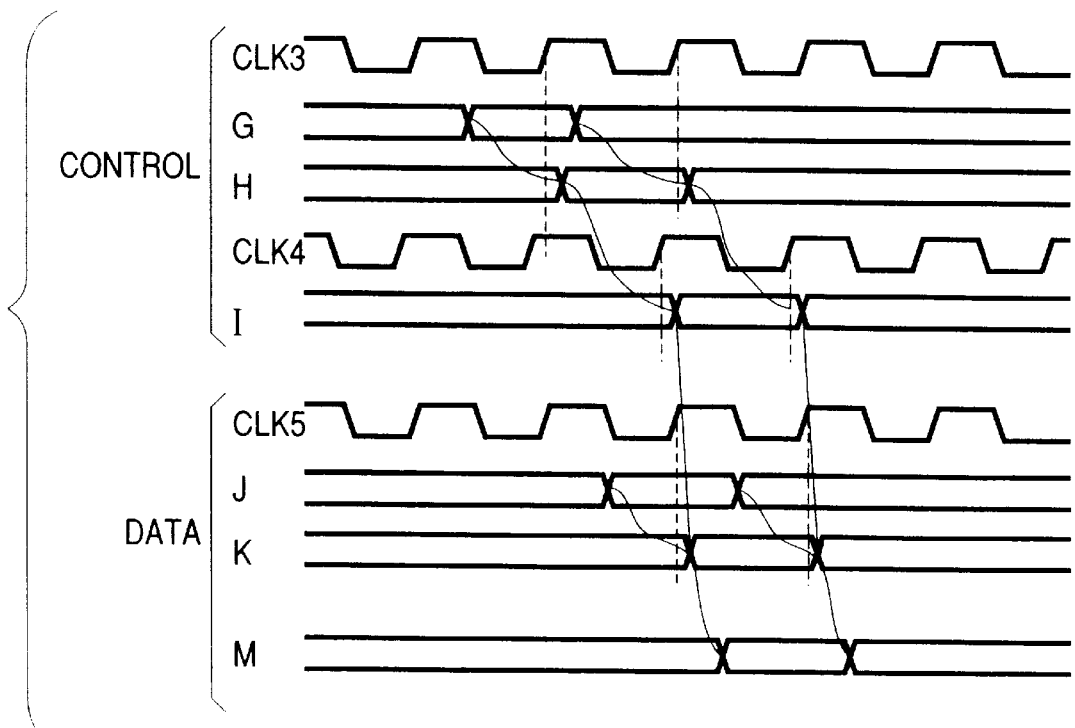
FIG. 14 is a timing chart used to explain an example of the read operation of the dynamic RAM section of the inventive semiconductor integrated circuit device.

FIG. 14 shows a timing chart which explains an example of the read operation of the dynamic RAM section of the inventive semiconductor integrated circuit device. Signals are divided into a control group and a data group also in this case. The control group includes as election clock signal CLK3, select signal G provided by the logic circuit, a decode signal H, a decoder clock signal CLK4, and a data latch signal I, and the data group includes an output clock signal CLK5, main amplifier output data J, selected output data K, and output data M delivered to the logic circuit.

In this embodiment, for the 288-bit data amplified by the main amplifiers, two sets of data each having 72 bits plus 72 bits are selected by the decoded select signal and released. Namely, in this embodiment, the logic circuit (SRAM) is provided in the memory array section, and the output of the main amplifier section which is divided into four blocks around the noise suppressing capacitors is selected and released.

Figure 15:
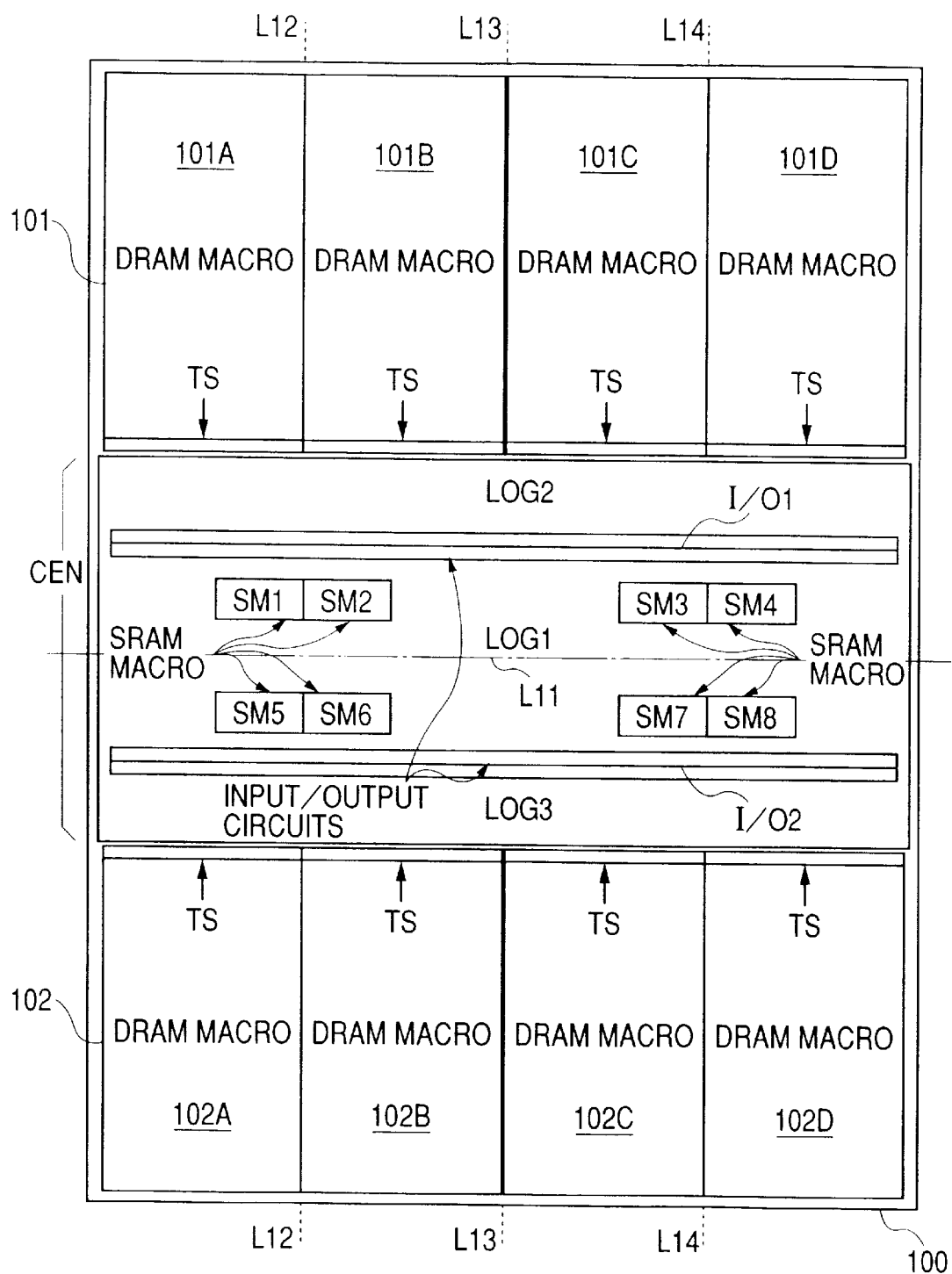
FIG. 15 is a layout diagram showing a semiconductor integrated circuit device incorporating a dynamic RAM based on another embodiment of this invention.

FIG. 15 shows in brief the layout of the semiconductor integrated circuit device incorporating a dynamic RAM based on another embodiment of this invention. In this embodiment, storage sections 101 and 102 formed of dynamic memory cells are divided into upper and lower sections in the longitudinal direction of the chip 100 (in the vertical direction of FIG. 14) as in the case of the preceding embodiment of FIG. 1. The divided upper and lower storage sections 101 and 102 are each further divided into four memory array sections (called DRAM macros) 101A, 101B, 101C and 101D, and 102A, 102B, 102C and 102D, respectively. Each DRAM macro is identical to the memory array section of the preceding embodiment of FIG. 1, and explanation thereof will be omitted. These DRAM macros 101A–101D and 102A–102D have their control input terminals and data input/output terminals TS located on the side of the chip center section CEN.

In this embodiment, eight SRAM macros SM1–SM8 used as a buffer memory are disposed in the chip center section CEN. Disposed in the area between the storage sections 101 and 102, are logic circuits LOG1, LOG2 and LOG3 for implementing the data input/output control for the DRAM macros. First and second input/output circuits (I/O circuits) I/O-1 and I/O-2. which implement the data transaction with the external terminals are disposed between the logic circuit LOG2 and SRAM macros SM1–SM4 and between the logic circuit LOG3 and SRAM macros SM5–SM8, respectively.

These input/output circuits I/O-1 and I/O-2 are disposed virtually in parallel with the control input terminals and data input/output terminals TS of the DRAM macros 101A–101D and 102A–102D, respectively. The DRAM macros 101A–101D, input/output circuit I/O-1 and SRAM macros SM1–SM4 and the DRAM macros 201A–201D, input/output circuit I/O-2 and SRAM macros SM5–SM8 are disposed in a line symmetry fashion with respect to a line L11 which runs across amid the rectangular chip laterally. These input/output circuits I/O-1 and I/O-2 include the noise suppressing capacitors C as in the case of the preceding embodiment of FIG. 1.

Disposing the input/output circuits I/O-1 and I/O-2 in the center section CEN which is virtually equidistant from all DRAM macros minimizes the difference of line lengths to/from all macros. In addition, it reduces the average distance to all DRAM macros 101A–101D and 102A–102D, enabling the reduction of latency.

A DRAM macro (101A) and SRAM macro (SM1) are paired and disposed in a line symmetry fashion with respect to the line L11, and DRAM macros (101A and 102A) and SRAM macros (SM1 and SM5) are paired and disposed in a line symmetry fashion with respect to the line L12, L13 and L14. In consequence, it becomes possible for the scheme of using SRAM macros as buffer memory of DRAM macros to have a uniform distance between the paired DRAM macros and SRAM macros (101A and SM1, 101B and SM2, 101C and SM3, 101D and SM4, 102A and SM5, 102B and SM6, 102C and SM7, and 102D and SM8), minimize the delay of signals, and reduce the latency.

Figure 16:
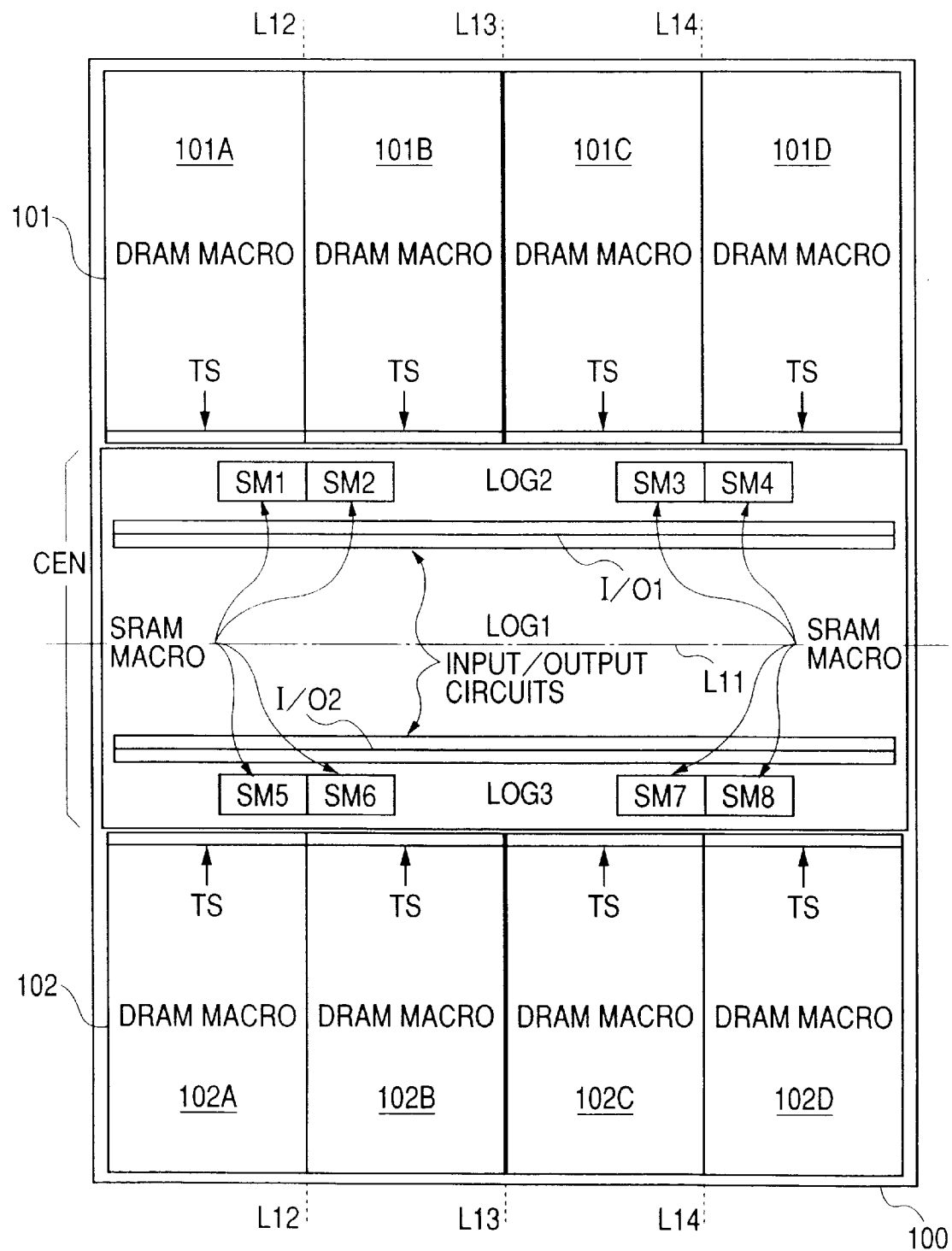
FIG. 16 is a layout diagram showing a semiconductor integrated circuit device incorporating a dynamic RAM based on still another embodiment of this invention.

FIG. 16 shows in brief the layout of a semiconductor integrated circuit device incorporating a dynamic RAM based on still another embodiment of this invention. This embodiment is derived from the embodiment of FIG. 1, with the SRAM macro in the central section being eliminated. The input/output circuits I/O-1 and I/O-2 are disposed symmetrically in parallel to the control input terminals and data input/output terminals TS of the DRAM macros 101A–101D and 102A–102D, respectively, thereby making uniform the distance between the corresponding DRAM macros and I/O circuits for the reduction of latency.

Figure 17:
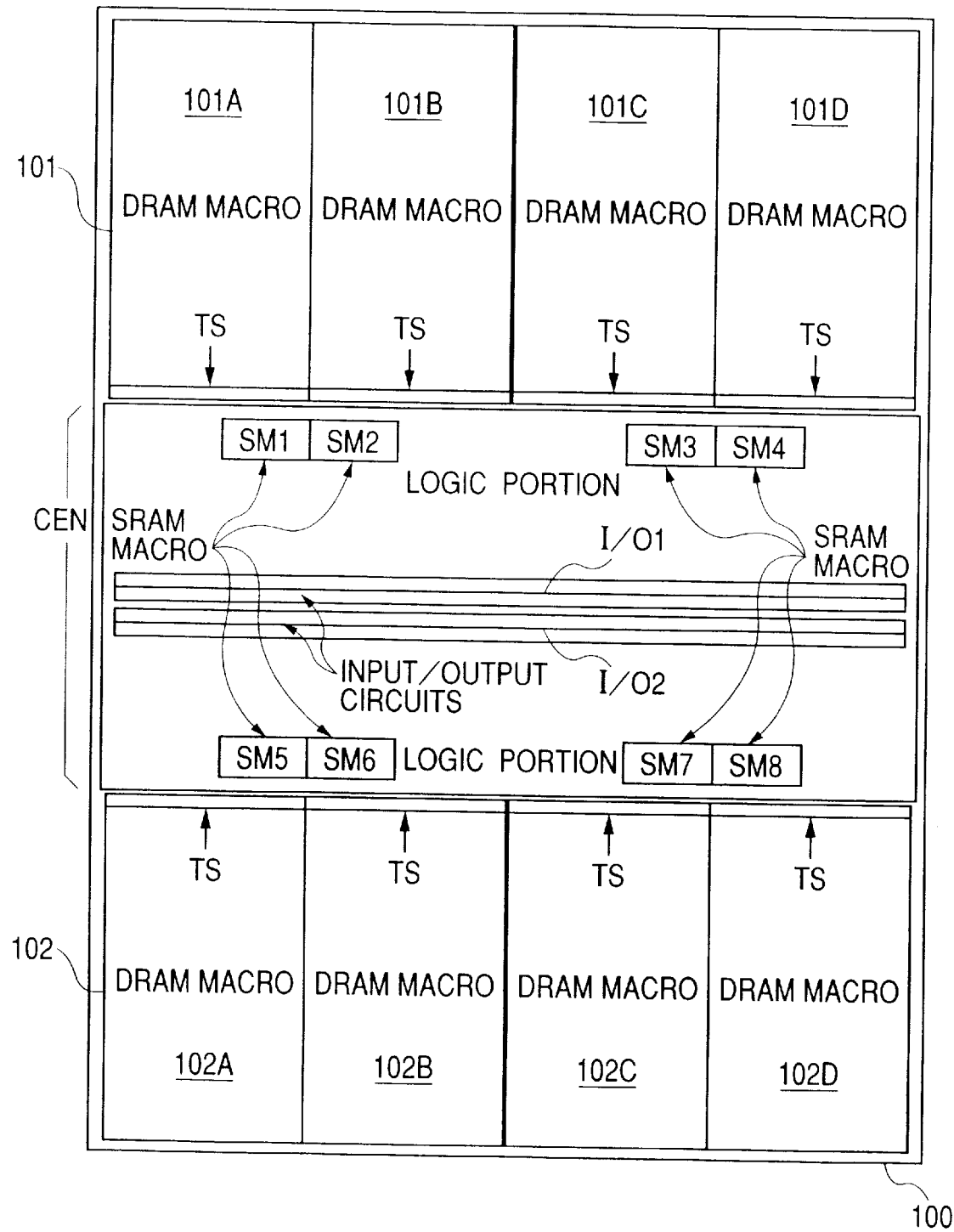
FIG. 17 is a layout diagram showing a semiconductor integrated circuit device incorporating a dynamic RAM based on still another embodiment of this invention.

FIG. 17 shows in brief the layout of a semiconductor integrated circuit device incorporating a dynamic RAM based on still another embodiment of this invention. This embodiment is designed to dispose both input/output circuits I/O-1 and I/O-2 together at the chip center and dispose the SRAM macros SM1–SM8 symmetrically in a one-to-one (or one-to-N) correspondence to the DRAM macros 101A–101D and 102A–102D and contiguously to the DRAM macros, thereby minimizing the signal delay between the DRAMs and SRAMs.

The effectiveness achieved by the foregoing embodiments is as follows.

(1). In a semiconductor integrated circuit device having amplifying MOSFETs of sense amplifiers for amplifying small voltages read out, of dynamic memory cells onto bit lines, a memory array including column switch MOSFETs for selecting bit lines, a read/write section including main amplifiers for reading stored data out of memory cells selected by the column switch, and a logic circuit section which implements the input/output operation of data with the read/write section, two capacitors each having a first electrode which corresponds to a plate electrode with the same structure of storage capacitors of dynamic memory cells and a second electrode which is multiple commonly-connected storage nodes of the storage capacitors are arranged in serial connection, disposed contiguously to the read/write section, and connected between the operation voltage lines of the read/write section, whereby an enhanced stability and reliability of operation are accomplished while at the same time the integration density and operation speed are increased.

(2) The memory array is disposed by interposing both sides of the read/write section, whereby the capacitors can be formed efficiently in correspondence to the divided memory arrays.

(3) The read/write section further includes write amplifiers and read/write control circuits, whereby the access path to the memory array section can be laid out in an orderly manner and the power noise suppressing capacitors also provide noise suppression in the write operation.

(4) The word line is designed according to the hierarchical word line scheme in which multiple sub word lines are allotted commonly to each main word line, the gate of an address selecting MOSFET of a dynamic memory cell is connected to a sub word line, one of the sub word lines is selected by a sub word driver which receives a signal on the main word line and a signal on the sub word selection line, and the memory array is arranged by being divided by the areas of the sub word drivers and sense amplifiers, so that the memory array section has an increased storage capacity, whereby an enhanced stability and reliability of operation is accomplished while at the same time the integration density and operation speed is increased.

(5) In the semiconductor integrated circuit device, the memory array section and the peripheral circuit which constitutes the address selection circuit for the bit lines or word lines are disposed in the logic circuit section, and two capacitors each having a first electrode which is a plate electrode with the same structure of storage capacitors and a second electrode which is multiple commonly-connected storage nodes of the storage capacitors are arranged in serial connection, disposed between the peripheral circuit and logic circuit section, and connected between the operation voltage lines, whereby the influence of noises between the peripheral circuit section and logic circuit section can be reduced in addition to the foregoing effectiveness.

(6) In the semiconductor integrated circuit device, two capacitors each having a first electrode which is a plate electrode with the same structure of storage capacitors and a second electrode which is multiple commonly-connected storage nodes of the storage capacitors are arranged in serial connection, disposed contiguously to a data input/output circuit which transacts data with the external terminals of the semiconductor integrated circuit device, and connected between the operation voltage lines, whereby the influence of noises between the input/output circuit and logic circuit can be reduced in addition to the foregoing effectiveness.

(7) In the semiconductor integrated circuit device, the two capacitors are each formed in the same process as that of the source-drain diffusion layer of the address selecting MOSFET, and are formed by the formation of a diffusion layer on the semiconductor substrate so as to connect multiple storage nodes which correspond to the plate electrode, and are each made up of a first electrode of conductive poly-silicon layer which is formed to join the storage node to a dielectric film, a second electrode of a conductive poly-silicon layer which is connected at its one end to the diffusion layer, and a contact section which connects the first and second electrodes, whereby power noise suppressing capacitors can be formed by using the same process as that of memory cells.

(8) The contact section and second electrode are formed to be identical in size to the bottom of the first electrode, thereby reducing the internal resistance of the capacitor, whereby the noise suppression effect can be enhanced.

(9) The second electrodes corresponding to multiple storage nodes which align along a first imaginary line running in a first direction are formed as a unitary member, thereby further reducing the internal resistance of the capacitor, whereby the noise suppression effect can be enhanced.

(10) The second electrodes corresponding to multiple storage nodes which align along a first imaginary line running in a first direction and the contact section are formed as unitary members, thereby further reducing the internal resistance of the capacitor, whereby the noise suppression effect can be enhanced.

(11) In a semiconductor integrated circuit device having a memory cell array which includes multiple word lines, multiple bit lines and multiple dynamic memory cells located at the intersections of the word lines and bit lines, multiple sense amplifiers which are connected to the bit lines and adapted to amplify signals read out of the dynamic memory cells, common data lines provided commonly to the bit lines, a column switch which transfers the signals on the bit lines to the common data lines selectively, main amplifiers which amplify the signals placed on the common data lines, a pair of power lines which are connected to the main amplifiers to supply a power voltage, and a stabilizing circuit including capacitance elements connected between the power lines, the dynamic memory cells each include a storage capacitor and a selecting MOSFET, with one electrode of the storage capacitor being connected to a corresponding bit line through the source-drain path of the selecting MOSFET and another electrode corresponds to a plate electrode of a certain shape formed on the semiconductor substrate, and with the one electrode of the capacitance element being formed in a plate electrode forming process to have the certain shape, whereby enhanced stability and reliability of operation are accomplished while at the same time the integration density and operation speed are increased.

(12) In a semiconductor integrated circuit device having a memory cell array which includes multiple word lines, multiple bit lines and multiple dynamic memory cells located at the intersections of the word lines and bit lines, multiple sense amplifiers which are connected to the bit lines and adapted to amplify signals read out of the dynamic memory cells, common data lines provided commonly to the bit lines, a column switch which transfers the signals on the bit lines to the common data lines selectively, main amplifiers which amplify the signals placed on the common data lines, a pair of power lines which are connected to the main amplifiers to supply a power voltage, and a voltage stabilizing circuit connected between the power lines, the dynamic memory cells each include a storage capacitor and a selecting MOSFET, with one electrode of the storage capacitor being connected to a corresponding bit line through the source-drain path of the selecting MOSFET and another electrode corresponding to a plate electrode of a certain shape formed on the semiconductor substrate, and the voltage stabilizing circuit includes a first and second capacitance elements which are connected in series between the power lines and a third and fourth capacitance elements which are connected in parallel to the first and second capacitance elements, respectively, with the first, second, third and fourth capacitance elements each having a first electrode of the certain shape, whereby enhanced stability and reliability of operation are accomplished while at the same time the integration density and operation speed are increased.

(13) The first electrodes of the first and third capacitance elements are connected to one of the power lines, the second electrodes of the first and third capacitance elements and the first electrodes of the second and fourth capacitance elements are connected together, and the second electrodes of the second and fourth capacitance elements are connected to another of the power lines, whereby the power stabilizing capacitors can be formed reliably at high density.

(14) The first electrodes are formed in the plate electrode forming process, thereby simplifying the mutual connection, whereby the power stabilizing capacitors can be formed simply at high density.

Although specific embodiments of the present invention have been explained, the present invention is not confined to these embodiments, but various changes are possible obviously within the scope of the substance of the invention. For example, the memory array can be arranged in various forms of practice. The word lines may be arranged based on the word shunt scheme besides the hierarchical word line scheme. The storage capacitors can be of any type formed in the same process as of the storage capacitors of dynamic memory cells. The present invention can be applied extensively to semiconductor integrated circuit devices which incorporate dynamic RAMS, internal logic circuits for controlling the RAM read/write operation, and buffer memories.

The present invention can be applied extensively to semiconductor integrated circuit devices which incorporate dynamic RAMS, internal logic circuits for controlling the RAM read/write operation, and buffer memories.

What is claimed is:

1. A semiconductor integrated circuit device comprising:
   a memory array including dynamic memory cells each made up of a storage capacitor and an address selecting MOSFET, with the gate of said address selecting MOSFET being connected to a word line, one source-drain being connected to a bit line which intersect said word line, and another source-drain being connected to a storage node corresponding to one electrode of said storage capacitor, and with a plate electrode corresponding to another electrode of this storage capacitor being supplied with a certain voltage; amplifying MOSFETs of sense amplifiers which amplify small voltages derived from information charges of said storage capacitors read out onto the bit lines; and column switch MOSFETs which select said bit lines;
   a read/write section including main amplifiers for reading out stored data from memory cells selected by said column switch; and
   a logic circuit section which implements the input/output operation of data with said read/write section,
   wherein two capacitors, each having a first electrode which is a plate electrode with the same structure as said storage capacitors and a second electrode which is multiple commonly-connected storage nodes of said storage capacitors, are arranged in serial connection, disposed contiguously to said read/write section, and connected between the operation voltage lines of said read/write section.

2. A semiconductor integrated circuit device according to claim 1, wherein said read/write section is arranged such that said memory array is disposed at both sides with the read/write section interposed therebetween.

3. A semiconductor integrated circuit device according to claim 2, wherein said read/write section further includes write amplifiers and read/write control circuits.

4. A semiconductor integrated circuit device according to claim 3, wherein said word line includes a main word line and a plurality of sub word lines allotted commonly to said main word line, the gate of the address selecting MOSFET of a dynamic memory cell is connected to a sub word line, one of said sub word lines is selected by a sub word driver which receives the signal on the main word line and the signal on the sub word select line, and said memory array is arranged by being divided by the areas of sub word drivers and sense amplifiers.

5. A semiconductor integrated circuit device according to claim 4, wherein a peripheral circuit which constitutes the address selection circuit for the bit lines or word lines of said memory array section is disposed in said logic circuit section, and two capacitors, each having a first electrode which is a plate electrode with the same structure as said storage capacitors and a second electrode which is multiple commonly-connected storage nodes of said storage capacitors, are arranged in serial connection, disposed between said peripheral circuit and logic circuit section, and connected between the operation voltage lines.

6. A semiconductor integrated circuit device according to claim 5 further including a data input/output circuit which transacts data with the external terminals of said integrated circuit device, with two capacitors, each having a first electrode which is a plate electrode with the same structure as said storage capacitors and a second electrode which is multiple commonly-connected storage nodes of said storage capacitors, being arranged in serial configuration, disposed contiguously to said data input/output circuit, and connected between the operation voltage lines.

7. A semiconductor integrated circuit device according to claim 6, wherein said two capacitors are each formed in the same process as that of the source-drain diffusion layer of the address selecting MOSFET, formed of a diffusion layer which is formed on the semiconductor substrate so as to connect multiple storage nodes which correspond to the plate electrode, and are each made up of a first electrode of conductive poly-silicon layer which is formed to join said storage node to a dielectric film, a second electrode of a conductive poly-silicon layer which is connected at its one end to said diffusion layer, and a contact section which connects said first and second electrodes.

8. A semiconductor integrated circuit device according to claim 7, wherein said contact section and said second electrode are formed to be identical in size to the bottom of said first electrode.

9. A semiconductor integrated circuit device according to claim 8, wherein said second electrodes corresponding to multiple storage nodes which align along a first imaginary line running in a first direction are formed as a unitary member.

10. A semiconductor integrated circuit device according to claim 9, wherein said second electrodes corresponding to multiple storage nodes which align along a first imaginary line running in a first direction and said contact sections are formed as unitary members.

11. A semiconductor integrated circuit device comprising:
a memory cell array which includes a plurality of word lines, a plurality of bit lines and a plurality of dynamic memory cells located at the intersections of said word lines and bit lines;
a plurality of sense amplifiers which are connected to said bit lines and adapted to amplify signals read out of said dynamic memory cells;
common data lines provided commonly to said bit lines;
a column switch which transfers the signals on said bit lines to said common data lines selectively;
main amplifiers which amplify the signals placed on said common data lines;
a pair of power lines which are connected to said main amplifiers to supply a power voltage; and
a stabilizing circuit including capacitance elements connected between said power lines,
said dynamic memory cells each including a storage capacitor and a selecting MOSFET, with one electrode of said storage capacitor being connected to a corresponding bit line through the source-drain path of said selecting MOSFET and another electrode corresponding to a plate electrode of a certain shape formed on the semiconductor substrate, and with said one electrode of said capacitance element being formed in a plate electrode forming process to have said certain shape.

12. A semiconductor integrated circuit device comprising:
a memory cell array which includes a plurality of word lines, a plurality of bit lines and a plurality of dynamic memory cells located at the intersections of said word lines and bit lines;
a plurality of sense amplifiers which are connected to said bit lines and adapted to amplify signals read out of said dynamic memory cells;
common data lines provided commonly to said bit lines;
a column switch which transfers the signals on said bit lines to said common data lines selectively;
main amplifiers which amplify the signals placed on said common data lines;
a pair of power lines which are connected to said main amplifiers to supply a power voltage; and
a voltage stabilizing circuit connected between said power lines,
said dynamic memory cells each including a storage capacitor and a selecting MOSFET, with one electrode of said storage capacitor being connected to a corresponding bit line through the source-drain path of said selecting MOSFET and another electrode corresponding to a plate electrode of a certain shape formed on the semiconductor substrate,
said voltage stabilizing circuit including a first and second capacitance elements which are connected in series between said power lines and a third and fourth capacitance elements which are connected in parallel to said first and second capacitance elements, respectively, with said first, second, third and fourth capacitance elements each having a first electrode of said certain shape.

13. A semiconductor integrated circuit device according to claim 12, wherein said first electrodes of said first and third capacitance elements are connected to one of said power lines, said second electrodes of said first and third capacitance elements and said first electrodes of said second and fourth capacitance elements are connected together, and said second electrodes of said second and fourth capacitance elements are connected to another of said power lines.

14. A semiconductor integrated circuit device according to claim 13, wherein said first electrodes are formed in said plate electrode forming process.

15. A semiconductor integrated circuit device comprising:
a memory cell array which includes a plurality of word lines, a plurality of bit lines and a plurality of dynamic memory cells located at the intersections of said word lines and bit lines;
a plurality of sense amplifiers which are connected to said bit lines and adapted to amplify signals read out of said dynamic memory cells;
common data lines provided commonly to said sense amplifiers;
a column switch which transfers the signals produced by said sense amplifiers to said common data lines selectively;
main amplifiers which amplify the signals transmitted to said common data lines;

a pair of power lines which are connected to said main amplifiers to supply a pair of power voltages; and a first and second stabilizing capacitance elements connected in series between said power lines, with said first and second stabilizing capacitance elements being applied on the connection node thereof an intermediate voltage of said power voltages.

16. A semiconductor integrated circuit device according to claim 15, wherein said first and second stabilizing capacitance elements are formed in the same process as that of storage capacitance elements which constitute said dynamic memory cells.

17. A semiconductor integrated circuit device according to claim 15, wherein said storage capacitance elements of said dynamic memory cells each have a pair of confronting electrodes having the same shape as that of a pair of confronting electrodes of each of said first and second stabilizing capacitance elements.

18. A semiconductor integrated circuit device comprising:

a memory cell array which includes a plurality of word lines, a plurality of bit lines and a plurality of dynamic memory cells located at the intersections of said word lines and bit lines;

a plurality of sense amplifiers which are connected to said bit lines and adapted to amplify signals read out of said dynamic memory cells;

common data lines provided commonly to said sense amplifiers;

a column switch which transfers the signals produced by said sense amplifiers to said common data lines selectively;

main amplifiers which amplify the signals transmitted to said common data lines;

a pair of power lines which are connected to said main amplifiers to supply a pair of power voltages; and stabilizing capacitance elements connected between said power lines, wherein storage capacitance elements which constitute said dynamic memory cells each have a pair of confronting electrodes having the same shape as that of a pair of confronting electrodes of said stabilizing capacitance elements.

19. A semiconductor integrated circuit device comprising:

a memory cell array which includes a plurality of word lines, a plurality of bit lines and a plurality of dynamic memory cells located at the intersections of said word lines and bit lines;

a plurality of sense amplifiers which are connected to said bit lines and adapted to amplify signals read out of said dynamic memory cells;

common data lines provided commonly to said sense amplifiers;

main amplifiers which amplify the signals transmitted to said common data lines;

a data output circuit which releases data produced by said main amplifiers;

a pair of first power lines which are connected to said main amplifiers to supply a pair of power voltages;

a pair of second power lines which are connected to said data output circuit to supply a pair of power voltages;

a first stabilizing capacitance element connected between said first power lines; and a second stabilizing capacitance element connected between said second power lines, wherein storage capacitance elements which constitute said dynamic memory cells each have a pair of confronting electrodes having the same shape as that of a pair of confronting electrodes of each of said first and second stabilizing capacitance elements.

20. A semiconductor integrated circuit device according to claim 19, wherein said first and second stabilizing capacitance elements are formed in the same process as that of said storage capacitance elements of said dynamic memory cells.

* * * * *